United States Patent

Hennes et al.

(10) Patent No.: US 10,710,870 B2
(45) Date of Patent: Jul. 14, 2020

(54) MEMS SENSOR STRUCTURE COMPRISING MECHANICALLY PRELOADED SUSPENSION SPRINGS

(71) Applicants: Stichting VU-VUMC, Amsterdam (NL); FOM-Nikhef, Amsterdam (NL)

(72) Inventors: Eric Hennes, Amsterdam (NL); Alessandro Bertolini, Diemen (NL); Johannes Franciscus Van Den Brand, Hilversum (NL)

(73) Assignees: STICHTING VU-VUMC, Amsterdam (NL); FOM-NIKHEF, Amsterdam (NL)

( * ) Notice: Subject to any disclaimer, the term of this patent is extended or adjusted under 35 U.S.C. 154(b) by 452 days.

(21) Appl. No.: 15/370,919

(22) Filed: Dec. 6, 2016

(65) Prior Publication Data

US 2017/0152135 A1    Jun. 1, 2017

Related U.S. Application Data

(63) Continuation of application No. PCT/EP2015/001150, filed on Jun. 8, 2015.

(30) Foreign Application Priority Data

Jun. 6, 2014 (NL) ...................................... 2012967

(51) Int. Cl.
*G01P 15/13* (2006.01)
*G01P 15/125* (2006.01)
(Continued)

(52) U.S. Cl.
CPC ........ *B81B 3/0078* (2013.01); *G01P 15/0802* (2013.01); *G01P 15/0907* (2013.01);
(Continued)

(58) Field of Classification Search
CPC .. G01P 15/125; G01P 15/0802; G01P 15/097; G01P 15/13; G01P 15/131
See application file for complete search history.

(56) References Cited

U.S. PATENT DOCUMENTS 3,505,866 A * 4/1970 Paros ........................ G01L 1/10
73/514.29
5,563,343 A * 10/1996 Shaw .................... B81B 3/0051
73/514.18
(Continued)

FOREIGN PATENT DOCUMENTS

CN        1826532 A     8/2006
CN      101174518 A     5/2008
(Continued)

OTHER PUBLICATIONS

International Search Report and Written Opinion for International application No. PCT/EP2015/001150, dated Sep. 17, 2015.
(Continued)

*Primary Examiner* — Helen C Kwok
(74) *Attorney, Agent, or Firm* — Steven M. Koehler; Westman, Champlin & Koehler, P.A.

(57) ABSTRACT

A MEMS sensor comprising preloaded suspension springs and a method for mechanically preloading suspension springs of a MEMS sensor are described. The MEMS sensor comprises a MEMS support structure; a plurality of suspension springs connected to the support structure; and, a proof mass flexibly suspended by the suspension springs; wherein at least one of the suspension springs is mechanically preloaded with a compressive force for reducing the natural frequency of said proof mass.

18 Claims, 16 Drawing Sheets

(51) Int. Cl.
*B81B 3/00* (2006.01)
*G01P 15/08* (2006.01)
*G01P 15/09* (2006.01)

(52) U.S. Cl.
CPC .......... *G01P 15/125* (2013.01); *G01P 15/131* (2013.01); *B81B 2201/0235* (2013.01); *B81B 2201/0285* (2013.01); *B81B 2203/0163* (2013.01)

(56) References Cited

U.S. PATENT DOCUMENTS

| | | | |
|---|---|---|---|
| 5,852,242 A | 12/1998 | Devolk | |
| 6,301,968 B1* | 10/2001 | Maruyama | G01S 17/58 356/484 |
| 6,497,149 B1* | 12/2002 | Moreau | G01P 15/125 73/514.32 |
| 6,803,755 B2* | 10/2004 | Herbert | B81B 3/0072 324/259 |
| 6,871,544 B1 | 3/2005 | Selvakumar | |
| 7,484,411 B2 | 2/2009 | Walmsley | |
| 2003/0183008 A1* | 10/2003 | Bang | B81C 1/0019 73/514.01 |
| 2006/0071578 A1* | 4/2006 | Drabe | G01C 19/5642 310/309 |
| 2006/0291794 A1* | 12/2006 | Liu | G02B 6/266 385/140 |
| 2008/0028857 A1 | 2/2008 | Ayazi | |
| 2010/0206071 A1* | 8/2010 | Rocznik | G01C 19/5726 73/504.12 |
| 2012/0048019 A1 | 3/2012 | Zhou | |
| 2012/0076172 A1* | 3/2012 | Gill | G01K 5/52 374/188 |
| 2014/0165724 A1* | 6/2014 | Krylov | G01P 15/097 73/514.15 |
| 2014/0238132 A1* | 8/2014 | Jeong | G01P 15/097 73/514.29 |
| 2015/0226762 A1* | 8/2015 | Seshia | G01P 1/006 73/495 |

FOREIGN PATENT DOCUMENTS

| | | |
|---|---|---|
| WO | 2010107436 A1 | 9/2010 |
| WO | 2012153335 A1 | 11/2012 |

OTHER PUBLICATIONS

Baeten G. et. al. D. 2013 "The use of low frequencies in a full-waveform inversion and impedance inversion land seismic case study", Geophysical Prospecting 61 701.

Laine J., Mougenot D. 2014 "A high-sensitivity MEMS-based accelerometer" The Leading Edge 33 1234.

Milligan D.J. et. al. 2011 "An ultra-low noise MEMS accelerometer for seismic imaging" Proc. IEEE Sensor 2011 1281.

J. Micromech. Microeng. 22(2012) 015008, "Single mask, simple structure micro rotational motor driven by electrostatic comb-drive actuators."

Chinese Office Action for Chinese Patent Application No. 201580039226.5, dated Jun. 22, 2018 with English translation.

\* cited by examiner

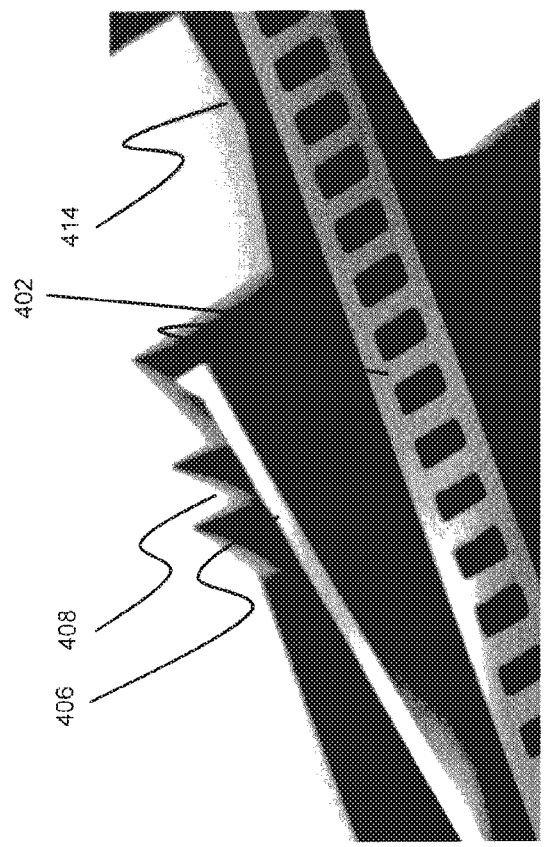
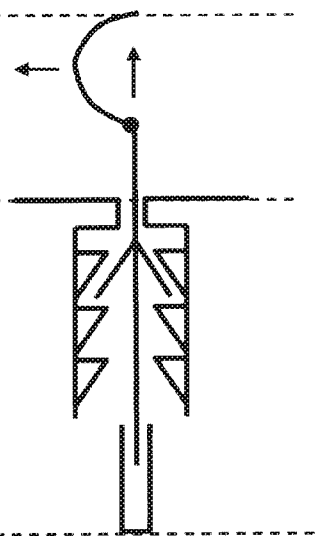
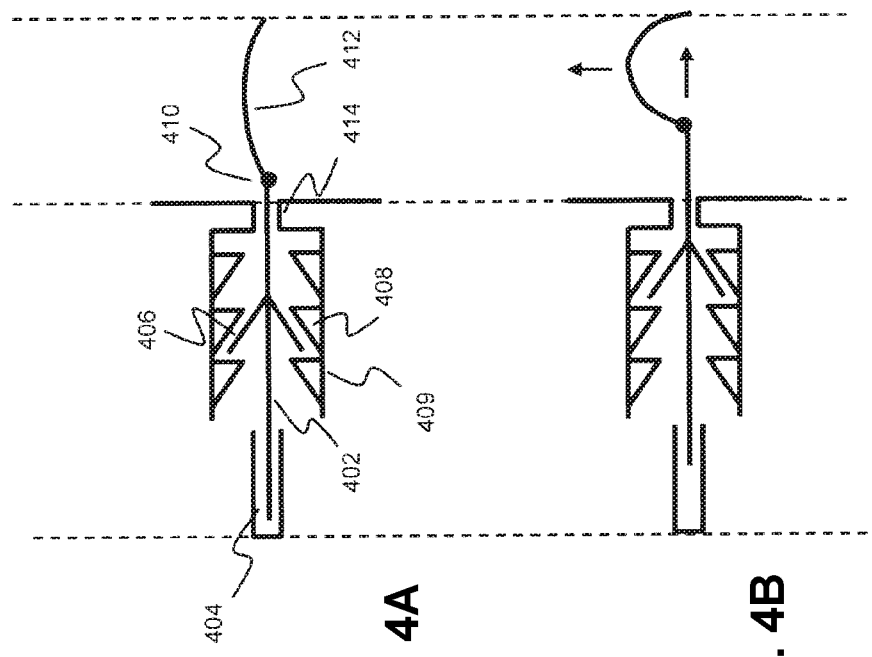
FIG. 4C
FIG. 4A
FIG. 4B

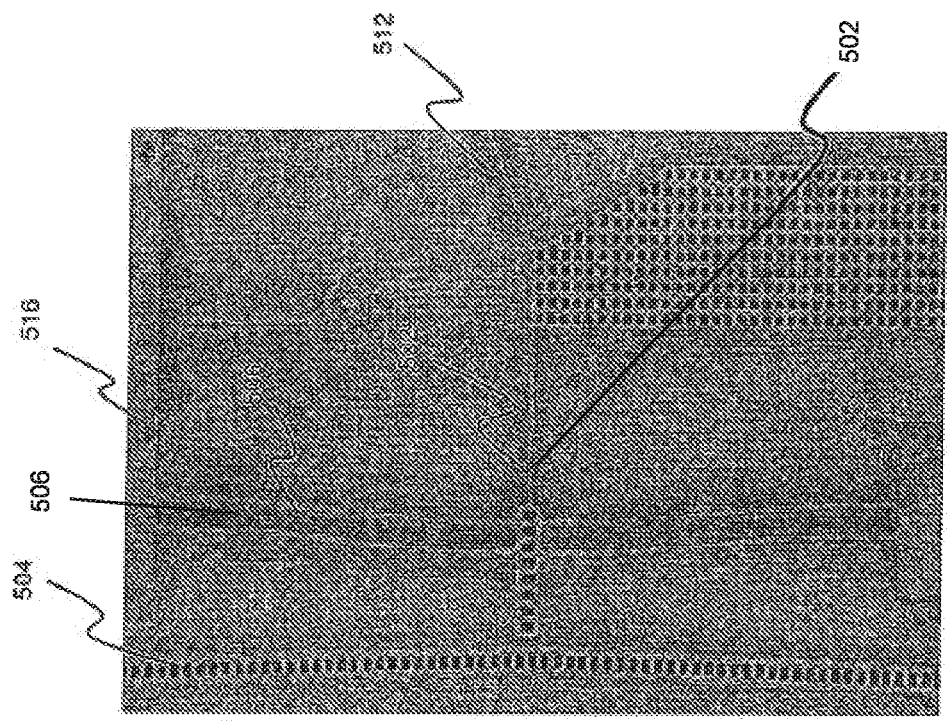
FIG. 5C
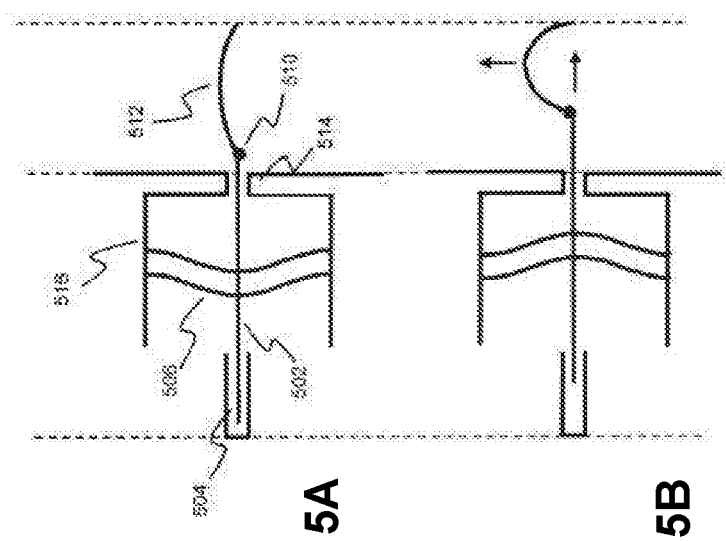
FIG. 5A
FIG. 5B

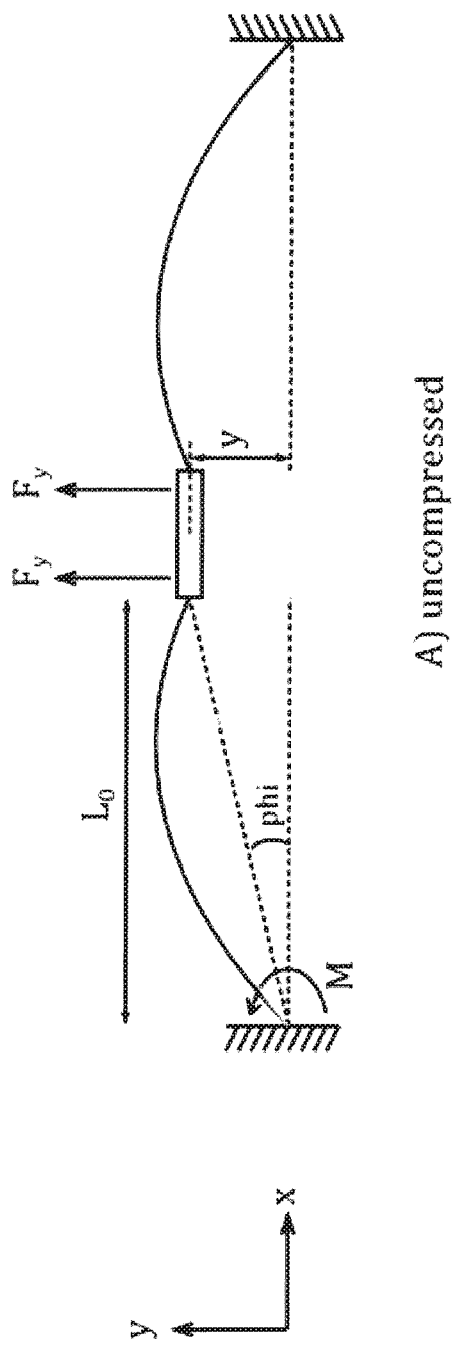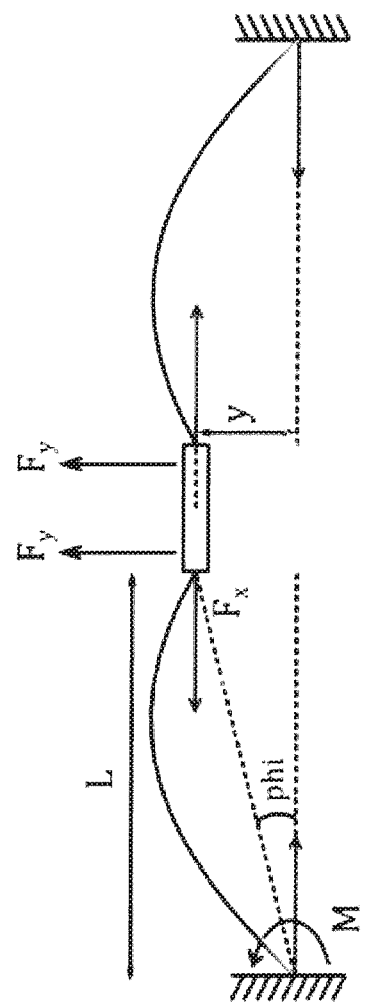
FIG. 8

MEMS SENSOR STRUCTURE COMPRISING MECHANICALLY PRELOADED SUSPENSION SPRINGS

CROSS-REFERENCE TO RELATED APPLICATION

The present application is a continuation of and claims priority of International patent application Serial No. PCT/EP2015/001150, filed Jun. 8, 2015, and published in English as WO2015/185222A1 the content of which is hereby incorporated by reference in its entirety.

FIELD OF THE INVENTION

The invention relates to a MEMS structure comprising one or more mechanically preloaded suspension springs, and, in particular, though not exclusively, an inertial MEMS sensor comprising one or more mechanically preloaded suspension springs and a method for mechanically preloading one or more suspensions springs in a MEMS sensor.

BACKGROUND OF THE INVENTION

The discussion below is merely provided for general background information and is not intended to be used as an aid in determining the scope of the claimed subject matter.

Seismic sensor networks are used for seismic imaging in order to provide three-dimensional images allowing detailed examination of the Earth's structure and localization of oil and gas reservoirs. Accurate imaging is crucial for determining the optimal location of drilling and increasing the extraction of the oil or gas out of a reservoir.

Geophones, passive inertial velocity sensors, are the most widely used sensors in the seismic industry due to their good sensitivity (typically better than 10 ng/√Hz between 5 and 30 Hz), low cost and ruggedness. Nevertheless as described in Baeten G. et. al. D. 2013 "The use of low frequencies in a full-waveform inversion and impedance inversion land seismic case study" Geophysical Prospecting 61 701, the higher resolution in deep soil imaging aimed nowadays, requiring low noise vibration sensing at low frequencies (1-5 Hz), is challenging to achieve with standard geophones due to the 40 dB/decade drop of their response below the natural frequency of the proof mass suspension.

In principle, better signal-to-noise ratio could be achievable with lower (<10 Hz) natural frequency geophones, but the poorer achievable manufacturing tolerance in the mechanical parameters, the larger sensitivity of the mechanical response to the deployment angle and the larger distortion figure are considered major disadvantages. Use of arrays of 10 Hz geophones is common in field practice instead. For these reasons, inertial sensors have been developed on the basis of the micro-electromechanical systems (MEMS) technology.

Typically these MEMS sensors include a proof mass that is suspended by springs and the movements of the mass may be detected by a capacitive read-out scheme. Force balance closed-loop configuration may be implemented by integrating electrostatic force actuators in the chip structure. Typically combs of interleaved finger-like structures, both in gap changing and linear configuration, are used for sensing and actuation (see an example in U.S. Pat. No. 5,563,343).

Major advantages of MEMS are considered flat-to-DC amplitude and phase frequency response, very low distortion and independency of the response on the deployment tilt angle. In principle MEMS are also suitable for low cost, high volume production. Self-noise wise, commercial MEMS seismic sensors with resolution better than 25 ng/√Hz above 3 Hz (sensible for oil exploration applications) are nowadays available as e.g. described in the article by Laine J., Mougenot D. 2014 "A high-sensitivity MEMS-based accelerometer" The Leading Edge 33 1234.

Nevertheless even better noise performance at low frequencies would be desirable to improve the quality of seismic imaging. The resolution in MEMS inertial sensors is limited first by the suspension Brownian noise, the level of which is set by the size of the proof mass and by the mechanical dissipation phenomena taking place in the chip. A general expression for the acceleration Brownian noise spectrum $a_{br}$ is given by (Eq. 1)

$$a_{br} = \frac{1}{m}\sqrt{4K_B T\left(D + \frac{k\phi}{2\pi f}\right)}$$

where m is the proof mass, $K_B$ is the Boltzmann constant, T is the temperature, D is the viscous damping factor in [kg/s], k is the elastic contribution to the stiffness of the suspension, φ is the internal friction loss angle and f is the frequency. Viscous damping, due to gas drag and squeezed film effects, can be strongly mitigated by packaging the MEMS at low pressure; modern getter based solutions allow stable and reliable vacuum levels down to 1 mTorr. At these pressures the structural damping limit, due to the internal friction ($\phi \cong 10^{-6}$ for single crystal silicon) of springs and their anchors to the chip substrate, may be reached.

State-of-the-art MEMS seismic sensors achieve Brownian noise levels below 10 ng/√Hz by using proof masses from one to 30 milligrams, depending on the chip design and packaging pressures (see e.g. Milligan D. J. et. al. 2011 "An ultra-low noise MEMS accelerometer for seismic imaging" Proc. IEEE Sensor 2011 1281). The other limit to resolution is set by the readout noise, e.g. by the minimum proof mass displacement detectable by the built-in capacitance sensor. If $x_n$ is the equivalent displacement noise spectral density of the capacitance readout, the corresponding acceleration noise spectrum $a_{rd}$ is given by (Eq. 2)

$$a_{rd} = x_n \cdot 4\pi^2 \sqrt{(f_0^2 - f^2)^2 + \left(\frac{k\phi}{2\pi m} + \frac{Df}{m}\right)^2}$$

where $f_0$ is the sensor natural frequency. At $f < f_0$ the Eq.2 simply reduces to $a_n \cong (2\pi f_0)^2 x_n$. Therefore enhancement of sensitivity at low frequencies can be achieved by reducing either $f_0$ or $x_n$. Lowering the natural frequency requires lowering the stiffness of the suspension springs and/or increasing the mass of the proof mass.

These parameters are however dependent on the MEMS technology and there is little room for varying these parameters without a substantial increase of the complexity of the design and/or fabrication process. In particular it is challenging to create MEMS structures with low stiffness along a desired axis while maintaining high stiffness in the other directions; having spurious modes within the measurement frequency band is not desirable and for this reason state-of-the-art devices are designed with natural frequencies of a few hundreds Hz.

By taking advantage of the electrostatic non-linearity of gap changing sensing/actuation capacitive structures, the stiffness of the mass-spring system can be electrically controlled as described in U.S. Pat. No. 5,852,242. In such a scheme, the dynamics of the mass-spring system is determined by an effective spring constant $k_m+k_e$, wherein $k_m$ is the mechanical spring constant and wherein $k_e$ is the electrostatic spring constant which has a negative value. In practical embodiments of U.S. Pat. No. 5,852,242 the MEMS inertial sensor structure is processed with a natural frequency of several hundreds of Hz, for the above-mentioned reasons.

Achieving, with the described method, a significant stiffness reduction on such a mechanical system, is only possible by using very narrow gaps in the capacitive structures, combined with large electrostatic forces applied to the sensor proof mass. This limitation can be simply clarified by considering the effect of a parallel plate electrostatic actuator (with gap d and capacitance C) on a mass m suspended by means of a spring with elastic stiffness km (and natural frequency $f_0$): by applying a voltage V between the actuator plates, the electrostatic force on the mass is $F=CV^2/2d$, while the electrostatic negative stiffness is $k_e=2F/d$. By expressing F as a multiple of the suspended mass weight, e.g. F=Nmg, and being $k_m=2\pi m f_0^2$, the electrostatic-to-elastic stiffness ratio is given by (Eq. 3)

$$\frac{k_e}{k_m} = \frac{Ng}{2\pi^2 f_0^2 d}$$

For example, with $f_0$=1000 Hz this ratio is approximately 0.5N/d(in micron) (Eq.4). Hence, in this case, achieving even only a factor of 2 stiffness reduction, it would require, for instance, to realize capacitive structures with 2 µm gaps and to apply to the proof-mass of the MEMS sensor static forces twice the weight of the proof-mass itself. Creating such structures is possible by means of relatively complex fabrication processes, like the one described in U.S. Pat. No. 6,871,544B1 in which different wafers are stacked on top of each other in order to realize the desired mass-spring and electrode configuration. Further, the need of small gaps implies that the sensor can only be implemented on the basis of a closed-loop configuration. The resolution of such commercially available sensors typically ranges in the order of 30 ng/√Hz.

Instead of reducing the stiffness of the proof mass suspension as in the above-described example, a capacitance readout as described in WO2010/107436 may be used to increase the sensitivity of the MEMS sensor. The readout, combined with a relatively large proof mass (around 30 mg) for limiting the Brownian motion amplitude, allows achieving a sensitivity of the order of 10 ng/√Hz. Such a performance can be obtained by operating the MEMS in open-loop configuration and by using a relatively stiff suspension system, e.g. a natural frequency of a few hundreds of Hz. An alternative means of improving the noise figure of the capacitive readout is described in US2008028857.

Further improvements in the resolution of MEMS inertial sensors may go through implementation of readout systems based on integrated optical interferometry, technology proven in laboratory devices but still requiring complex and expensive fabrication processes that make it, to date, not suitable for applications in large sensor networks.

Hence from the above, it follows that there is a need in the art for improved inertial MEMS sensors that have a sensitivity better than 10 ng/√Hz down to 1 Hz making use of conventional capacitance bridge readout and that are robust and simple to fabricate with high yield in a batch process.

SUMMARY OF THE INVENTION

The Summary and the Abstract herein are provided to introduce a selection of concepts in a simplified form that are further described below in the Detailed Description. This Summary and the Abstract are not intended to identify key features or essential features of the claimed subject matter, nor are they intended to be used as an aid in determining the scope of the claimed subject matter. The claimed subject matter is not limited to implementations that solve any or all disadvantages noted in the background.

The natural frequency is the major parameter in the design of MEMS devices with moving (mechanical) parts, since it determines the sensitivity of the MEMS sensor to a mechanical stimulus. In conventional MEMS devices the design of compliant mechanisms is limited to combinations of cantilever springs; this aspect together with the limitations from available micro machining processes (minimum feature size, aspect ratio etc.) makes it difficult to realize structures with low natural frequencies (<100 Hz), highly desirable for low acceleration (sub micro-g) detection, without substantially increasing the complexity of the sensor design or fabrication. These problems are solved by using MEMS structures with mechanically preloaded springs. The mechanically preloaded springs allow tuning of the natural frequency to a desired lower value without substantially increasing the complexity of the sensor design or fabrication process.

In a first aspect, the invention may relate to a MEMS sensor, preferably an inertial MEMS sensor, which comprises a MEMS support structure; a plurality of suspension springs connected to said support structure; and, a proof mass flexibly suspended by said suspension springs; wherein at least one of said suspension springs is mechanically preloaded with a compressive force for reducing the natural frequency of said proof mass.

Hence, a mechanical spring loading mechanism, preferably on-chip, can be used in MEMS sensors and that enables improved stiffness reduction of the suspension springs attached to the proof mass in a completely passive way. The mechanical spring loading mechanism may be activated once and thereafter may maintain a static compressive force onto the suspension springs for the rest of the lifetime of the sensor chip. The mechanical spring loading mechanism provides a very robust and low-noise means for reducing the stiffness (and thus the natural frequency) of the suspension springs. The mechanical spring loading mechanism may be simply fabricated on-chip close to the suspension springs in the same process steps that are used for forming the rest of the MEMS sensor, e.g. the suspension springs and the proof mass.

The mechanical pre-loading system of the inertial sensors provides a negative stiffness mechanism which is purely passive and does not rely on tight gap strong electrostatic actuators. In this respect the mechanical anti-spring is a breakthrough because in principle the natural frequency can be arbitrarily lowered maintaining a very high rejection of the accelerations along the cross axes (i.e. the axes perpendicular to the sensor's sensitive direction).

In an in-plane proof mass suspension using conventional cantilever springs, the stiffness along the out of plane axis depends on the aspect ratio of the suspending beams. In order to reduce the natural frequency only longer beams can be used. The result is that also the out of plane stiffness is reduced. This is not true in a system with mechanically pre-loaded anti-springs for which the out of plane stiffness of the mechanics is that of the suspension in the uncompressed state. The mechanically pre-loaded anti-spring system allows reduction of the natural frequency without compromising the rigidity of the suspension of the proof mass along the other axes.

In an embodiment, said sensor may further comprise at least one actuator, preferably an electro-thermal actuator, for mechanically applying said compressive force to least one of said suspension springs, preferably said actuator comprising a guided actuator beam connected to and/or engaged with said suspension spring for applying a compressive force to said suspension spring.

In an embodiment, said sensor may further comprise a locking mechanism, preferably a mechanical locking mechanism, for maintaining a predetermined compressive force to said suspension spring. Hence, once the actuator is de-activated the spring is prevented from releasing the compressive force.

In an embodiment, said locking mechanism may be configured for switching said suspension spring from a non-compressed state to one or more compressed states. In an embodiment, said locking mechanism may comprise at least one ratchet and a pawl, a ratchet comprising one or more ratchet positions associated with one or more compressed states respectively. In yet another embodiment said locking mechanism may comprise a two state locking spring system connected to said suspension spring for switching said suspension spring between a non-compressed state and a compressed state. Hence, different mechanical MEMS structures may be used in order to achieve a desired locking mechanism. When using a ratchet and pawl type of locking mechanism, multiple locking states associated with multiple different compressive states of the suspension spring may be achieved.

In an embodiment at least part of said at least one suspension spring may be configured as a suspended curved beam. A beam that is of a curved shape in the non-compressed state is very suitable for use in combination with a mechanical locking mechanism.

In an embodiment, the natural frequency of the mass-spring system may be controlled between $f_0$ and $0.05*f_0$, preferably between $f_0$ and $0.1*f_0$, more preferably between f0 and $0.2*f_0$. Hence, simple stiffness cancellation over a wide range of parameters by simply controlling the actuator when preloading the springs is provided.

In a further embodiment, said proof mass may be configured as a substantially planar element wherein the direction of said compressive force is in the plane of said proof mass.

In an embodiment, at least two of said suspension springs may be connected to opposite sides of said proof mass and wherein said at least two suspension springs are preloaded with a compressive force of substantial similar magnitude. This way, the position of the proof mass if not affected when preloading the suspension springs.

In an embodiment, the suspension beams may be configured for keeping the proof mass at an equilibrium position when a preloading force is applied on said suspension beams.

In an embodiment, the suspension beams are configured for compensating gravity when the sensing direction of the proof mass has a component along the direction of gravity. In an embodiment, each of said suspension springs are connected in a predetermined orientation with respect to said proof mass, preferably said orientation comprising an initial offset angle $\varphi_0$ defined by a first direction associated with said preloading force and a second direction defined first and second connection points, said first connection point connecting a first end of said suspension spring to said support structure and a second connection point connecting a second end of said suspension spring to said proof mass.

In an embodiment said suspension curved springs may be rotated by a suitable small angle with respect to the proof mass direction of motion to passively compensate for the effect of gravity. This way, vertically oriented or Galperin (54.7 degrees from the vertical direction, i.e. the direction of gravity) configurations of the MEMS sensor can be implemented.

Hence, by changing the orientation the suspension springs with respect to the direction of the mechanical preloading force, the MEMS sensor can be preferably configured to measure acceleration in horizontal, vertical or along any different inclination with respect to the direction of gravity. This way both frequency reduction and gravity compensation are achievable without electrical power consumption.

In an embodiment said proof mass may further comprise a capacitive element for detecting movements of said proof mass.

In an embodiment, at least one of said suspension springs may be mechanically preloaded using an electro-thermal actuator comprising a V-shaped suspended conductive beam, wherein the tip of said V-shaped suspended conductive beam is displaced in a predetermined direction as a function of the current that runs through said conductive beam. The electro-thermal actuator may be formed by a single etching step of the silicon device layer of e.g. a Silicon on Insulator (SOI) substrate.

In a further aspect, the invention may relate to a method for mechanically preloading at least one suspension spring of a MEMS sensor, preferably an inertial MEMS sensor, as described above, with a compressive force, wherein said method may comprise: activating an actuator connected to or in engagement with said at least one suspension spring, wherein before activation said suspension spring is in a non-compressed state; and, mechanically preloading said suspension spring by transforming a displacement of said activated actuator in a compression force in said suspension spring. Hence, method allows simple on-chip preloading of the suspension springs in order to tune the natural frequency of the mass-spring system to a desired value.

In an embodiment, said method may further comprise: deactivating said actuator if said displacement activates a locking mechanism for maintaining a predetermined compressive force on said suspension spring, preferably said suspension beam being configured as a suspended curved beam.

In an embodiment, said actuator may be configured as an electro-thermal actuator comprising a V-shaped suspended conductive beam, wherein said method may comprise: activating said actuator by running a predetermined current through said V-shaped suspended conductive beam, wherein the tip of said V-shaped suspended conductive beam is displaced as a function of said current.

The invention will be further illustrated with reference to the attached drawings, which schematically will show embodiments. It will be understood that the invention is not in any way restricted to these specific embodiments.

BRIEF DESCRIPTION OF THE DRAWINGS

FIG. 4A-4C depict schematics and a photograph of a mechanical locking structure for use in a MEMS structure according to an embodiment of the invention.

FIG. 5A-5C depict schematics and a photograph of a mechanical locking structure for use in a MEMS structure according to another embodiment of the invention.

FIG. 8A and FIG. 8B depict a model describing a compressive spring structure for use in a MEMS sensor according to an embodiment of the invention.

DETAILED DESCRIPTION

Figure 1:
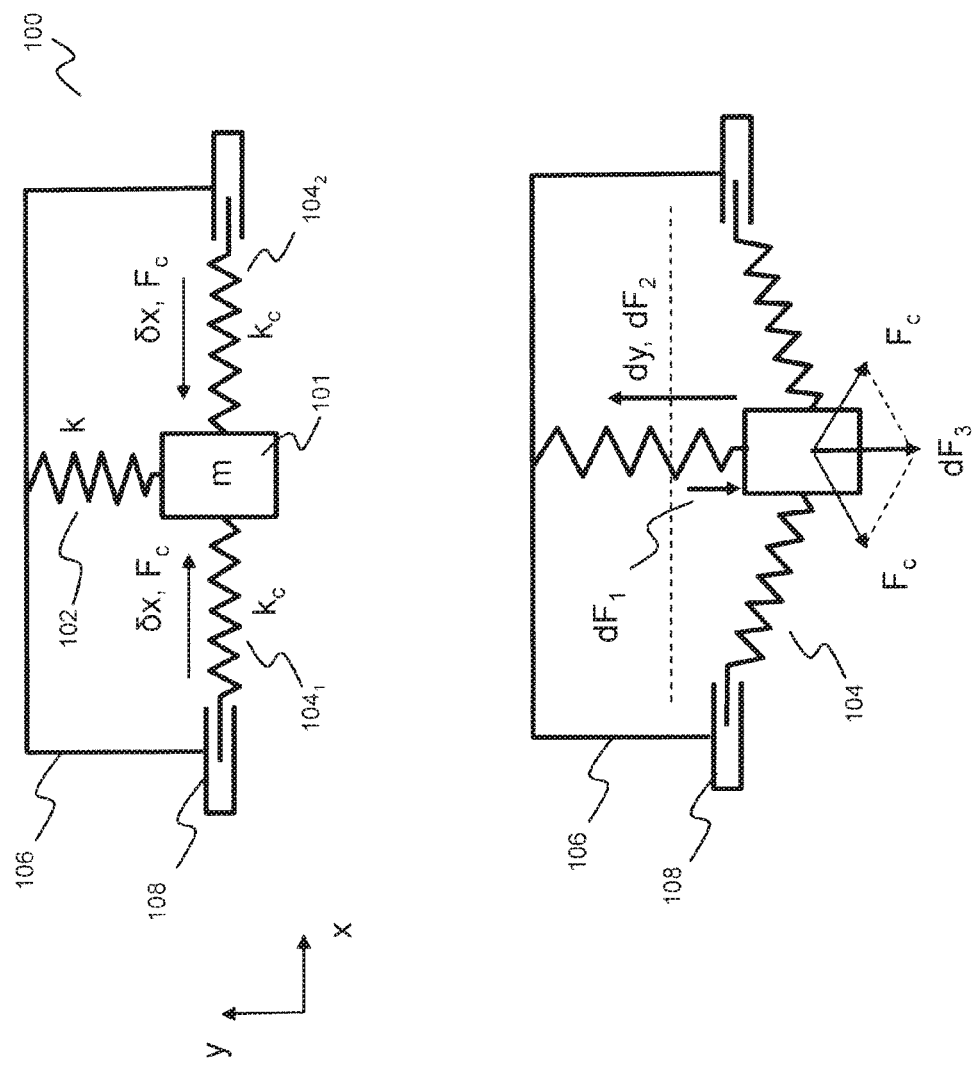
FIG. 1 depicts a MEMS structure comprising a compressive spring structure according to an embodiment of the invention.

FIG. 1 depicts a schematic of a MEMS structure comprising a mechanically preloaded spring system 100 according to an embodiment. In particular, FIG. 1 depicts a top view of a MEMS structure comprising a suspended mass 101 (i.e. a planar sheet of material) that is kept in a suspending state using several suspension beams. A suspension beam behaves like a spring that is characterized by a spring constant. The springs in FIG. 1 may have any suitable geometry, including meandering and/or serpentine spring designs. The MEMS structure of FIG. 1 may comprise a main suspension spring 102 and one or more mechanically preloaded suspensions springs $104_1, 104_2$ that connect the mass to a support structure 106. This way, the proof mass forms a suspended mass that is connected by the suspension springs to the MEMS support structure. In this particular embodiment, the main suspension spring (aligned along the y-axis) may have a spring constant k and the two preloaded suspensions springs (aligned along the x-axis) may have a spring constant $k_c$.

The two lateral springs may be mechanically pre-loaded on the basis of an external compressive force $F_c$. This force may be applied to a suspension spring using an actuator 108 that may be configured to compress the spring in a direction in the plane of the proof mass (in this case the x-direction) wherein the compressive force is approximately equal to $\delta x * k_c$ ($\delta x$ being the compressive deformation of the spring along the x-direction). The length of such a pre-loaded spring may be defined as $L(\delta x) = L_0 - \delta x$, where $L_0$ is the rest length. The compressive force applied to the first and second lateral springs may have substantially the same magnitude and may be of opposite sign so the their total (vector) sum in the plane of the proof mass is zero and so that the position of the proof mass will not be affected when the springs are preloaded by the actuators.

If the mass is subjected to an external force $dF_1$ along the y-direction, the mass will be displaced over a distance dy along the y-direction. Due to the displacement dy, the preloaded springs will be slightly tilted so that the y-components of compressive forces $F_c$ in the preloaded springs will generate a net force $dF_3 \cong 2F_c \cdot dy/L$ in the same direction as $dF_1$.

The two forces $dF_1$ and $dF_3$ will be counteracted by a spring force $dF_2$ which is equal to the spring constant k times the mass displacement dy. The compressive forces in the preloaded suspension springs thus effectively cause a reduction of the spring constant k (and thus in its stiffness) along the y-direction wherein the reduction is approximately equal to $2F_c/L_0$ since in typical embodiments of the system $\delta x/L_0 \ll 1$. Hence, due to the lateral preloaded springs, the effective spring constant of the mass-spring system may be given by the expression (Eq. 5) as $$k_{tot} \simeq k - \frac{2F_c}{L_0}$$

Hence, by controlling the compressive force in the springs (e.g. using an actuator), the total spring constant and thus the natural frequency of the MEMS structure may be controlled. As will be described hereunder, the natural frequency is a very important aspect in the design of any MEMS device. As will be shown hereunder in more detail, a MEMS mass-spring system that has a controllable natural frequency may be of particular use in MEMS sensors, in particular MEMS inertial sensors.

Figure 2:
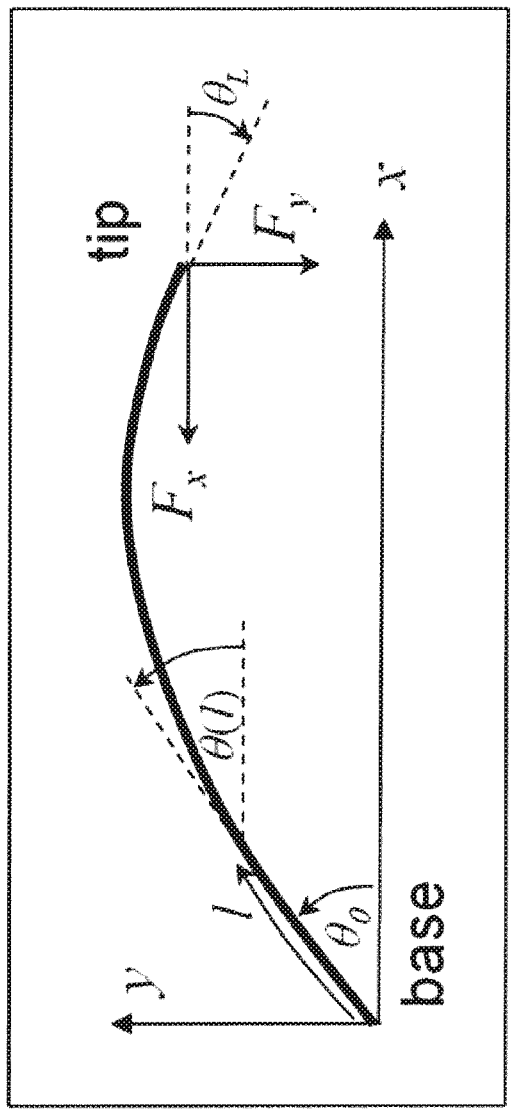
FIG. 2 depicts a compressive spring structure for use in an MEMS structure according to another embodiment of the invention.

In an embodiment, the stiffness reduction as described with reference to FIG. 1 may be obtained with conventional non-curved suspension beams. Alternatively, in another embodiment, a curved suspension beam as shown in FIG. 2 may be used. In particular, FIG. 2 depicts a curved elastic suspension beam (a curved cantilever beam or curved suspension spring) of length L, which is preloaded by a compressive force. In the non-compressed state, the curved beam has a predetermined non-stressed curved shape $\theta_i(l)$, wherein l is a curvilinear position coordinate along the beam and $\theta$ is the beam orientation with respect to the (global) x-axis. The curved beam may comprise a base (l=0) that is fixed to part of a MEMS structure (e.g. a proof mass as described with reference to FIG. 1) and tip (l=L) that may be connected to an actuator beam. When forces are applied to the curved beam, the change of the curve (change of the shape) of the beam may be described by a function $\theta(l)$.

FIG. 2 depicts a system wherein the tip (one side) of the beam may be subject to a compressive force $F_x$ along the x-axis and an external force $F_y$ along the y-axis. At low frequencies of interests, compared to the eigenmodes of the beam, $F_y$ may be described as the reaction force induced by a displacement between the proof mass and the frame of the MEMS structure (which in turn could be caused by an acceleration of the frame along the y-axis). In that case, the curve of the beam may be described by the equation (Eq. 6) given by $$E \frac{d}{dl}\left[I(l) \frac{d}{dl}(\theta(l) - \theta_i(l))\right] = F_x \sin\theta(l) - F_y \cos\theta(l)$$

where E represents the Young modulus of the blade beam material, $I(l)=w(l)t(l)^3/12$ is the second moment of area of the beam cross section, with t and w the beam thickness and beam width respectively, which—in general—both may depend on l and $\theta_i(l)$, wherein $\theta_i(l)$ is the beam orientation with respect to the (global) x-axis of the initially unstressed beam. Hence, in this particular case, the elastic beam may have a particular curved shape $\theta_i(l)$ in the non-compressed state and a particular curved shape $\theta(l)$ in the compressed state. On the basis of this equation, the effective spring constant of the preloaded elastic member may be estimated.

The curved beam configuration as shown in FIG. 2 has the advantage that it allows both preloading of the beam with a compressive force using e.g. an (electro-thermal) actuator and "locking" the thus preloaded beam using a mechanical locking structure. As will be described hereunder in more detail, the mechanical locking structure may be part of the same MEMS structure as the springs and e.g. a proof mass of a MEMS sensor. Although the preloading force in FIG. 2 is provided along the x-direction, in other embodiments other directions of the preloading force (e.g. y-axis or both x and y axis) are also foreseen.

Figure 3A:
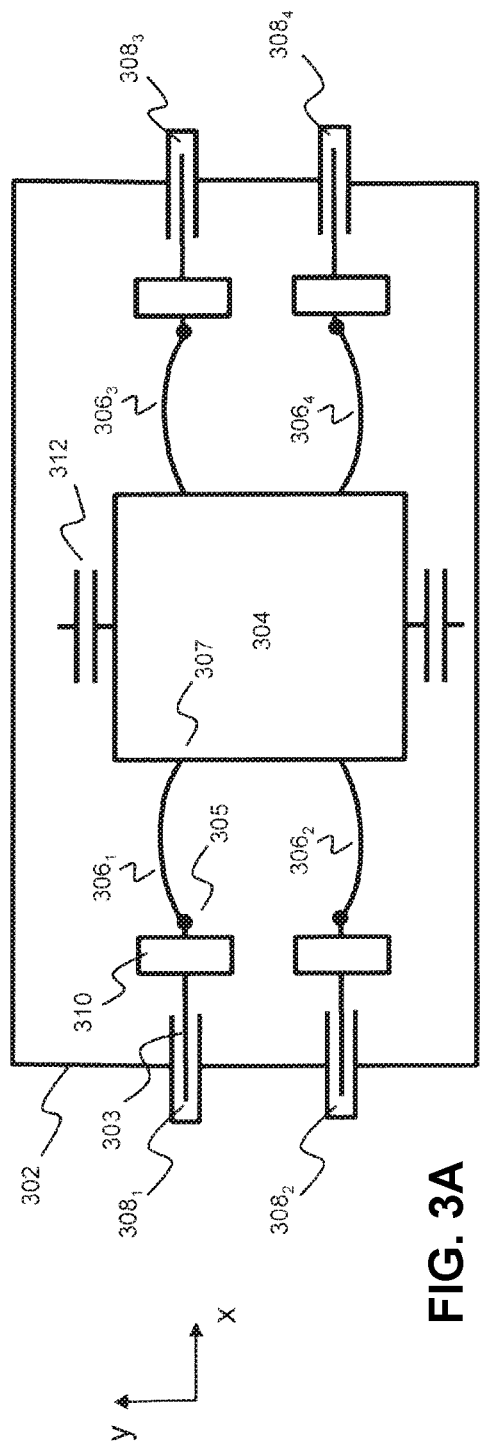
FIG. 3A and FIG. 3B depict a MEMS inertial sensor comprising a compressive spring structure according to an embodiment of the invention.
Figure 3B:
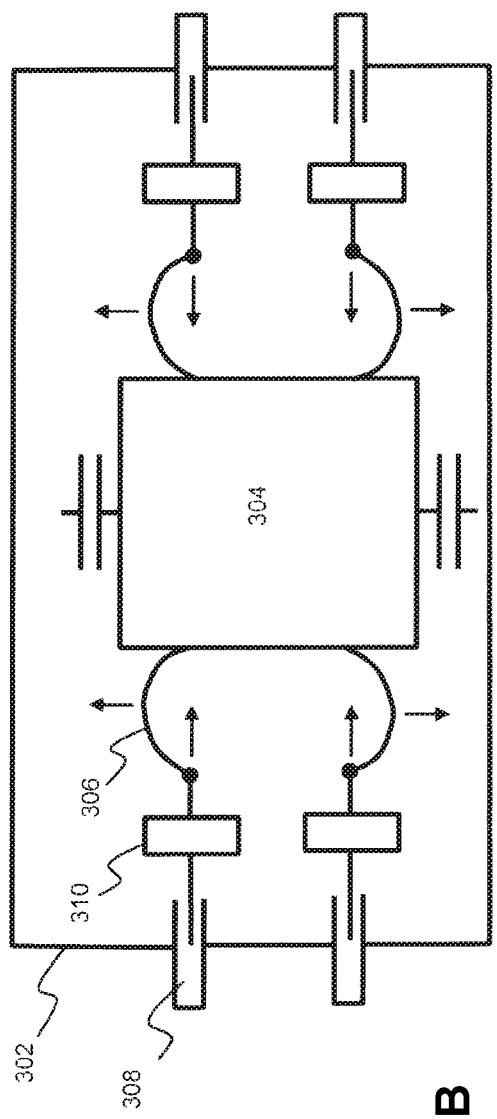

FIGS. 3A and 3B depict an inertial MEMS sensor comprising according to various embodiments of the invention. In particular, FIG. 3A depicts an inertial MEMS sensor comprising a proof mass 304 that is connected by suspension springs $306_{1-4}$ to a support structure 302. In particular, a first end of each suspension spring $306_{1-4}$ may be connected at first connection point 305 to a support structure and a second end of the suspension spring may be connected at a second connection point 307 to the proof mass. In this example, the direction of movement of the proof mass (the sensing direction) is along the y-direction. Control of the direction of movement may be realized by guiding structures around the proof mass (not shown). The MEMS sensor may comprise actuators $308_{1-4}$ for (on-chip) preloading of the suspension springs. In an embodiment, a curved suspension beam as described with reference to FIG. 2 may be used as suspension spring. An actuator beam 303 connected to the actuator $308_1$ may be connected to the first end of a suspension spring $306_1$. The actuator may move the actuator beam back and forward in a direction that is substantially perpendicular to the direction of movement of the proof mass. A guiding structure 310 attached to the MEMS support structure may ensure that the actuator beam controllably applies a compressive force to the suspension spring in a predetermined direction, in this example a direction perpendicular to the direction of movement of the proof mass. The curved suspension beams may be connected to the support structure and the proof mass such that when preloading the springs the proof mass is kept in balance in the sense that the position and orientation of the proof mass does not substantially change compared to the uncompressed state as depicted in FIG. 3A. The dimensions and geometry of the proof mass and the suspensions springs may be selected such that the mass-spring system has a certain natural frequency $f_0$ when the suspensions springs are in their non-compressed state.

The guiding structure and the actuator may be part of or may be rigidly connected to the support structure. The actuators may be activated in order to controllably apply a compressive force to the elastic beams as shown in FIG. 3B. Due to the compressive force, the elastic beams will be preloaded in a similar way as described with reference to FIG. 2 thereby effectively reducing the total stiffness of the mass-spring system of the inertial sensor. The proof mass may comprise electrodes for forming capacitive sensing elements 312, which may be used in order to detect movements of the proof mass with respect to the frame that are caused by frame vibrations within a certain low-frequency bandwidth, and to apply feedback forces in closed-loop operation.

A plurality of capacitive actuation elements may be used to separate the function of static and dynamic balancing servo actions possibly resulting in a larger output dynamic range. Balancing actuators may provide compensation for: processing inaccuracies, thermos-elastic effects, differences in local gravity acceleration, full compensation of gravity to implement omni-directional configurations of the MEMS sensor.

Hence, in the MEMS inertial sensor structure of FIG. 3B actuators may be used to apply a compressive force to the suspension springs in opposite directions such that the compressive forces applied to the springs do not affect the position of the mass. The force applied to the actuator beam and the guiding structure will cause deformation of the elastic beam so that a compression force is formed in the suspension beam. The magnitude of the compressive force may be controlled by controlling the displacement of the actuator. This way, the suspension springs may be mechanically pre-loaded in a controllable way, thereby effectively decreasing the spring constant of the suspension springs and thus the natural frequency of the mass-spring system. The preloaded suspension springs will effectively decouple the proof mass from the environment so that the responsivity of inertial sensing may be significantly increased. The increased responsivity to some accelerations may result in an inertial sensor having increased sensitivity.

In an embodiment, the guiding structures 310 may comprise a mechanical locking structure preventing the preloaded spring to move back to its initial (unloaded) state if e.g. the actuator force is released. In one embodiment, the mechanical locking structure may comprise a first locking state associated with non-loaded suspension spring and a second locking state associated with a preloaded suspension spring. When the actuator is activated, the locking structure may allow the spring to be moved from a non-compressed first position into a compressed second position. This way the suspension spring may be preloaded with a predetermined compressive force even when the actuator itself moves back to its initial position. In an embodiment, the spring may be moved irreversibly to the compressed second position.

In another embodiment, the mechanical locking mechanism may comprise multiple locking states wherein one state of the locking mechanism is associated with the suspension spring in an uncompressed state and at least two or more states are associated with different compressed states of the suspension spring. Hence, in this embodiment, the actuator may be used to mechanically set the suspension spring in one of the two or more positions associated with the different compressed states of the suspension spring.

FIG. 4A-4C depict schematics and a photograph of a mechanical locking structure for use in a MEMS structure according to an embodiment of the invention. In particular, in FIG. 4A, a mechanical MEMS locking structure is depicted wherein an actuator beam 402 connected to an actuator 404 comprises one or more pawls 406 (e.g. elastic beams) that engage with one or more ratchets 408 that are formed in or onto the MEMS support structure 409. The actuator beam is further connected to an end 410 of the suspension spring 412. A guiding element 414 connected to the MEMS support structure may ensure that the actuator beam is moved in the desired direction and that the compressive force is applied to the elastic beam in that direction.

The ratchet may be formed by a linear arrangement of asymmetrically formed sawtooths. As shown in FIG. 4B due to the sawtooth form of the ratchet, the one or more elastic pawl beams attached to the actuator beam may slide over the one or more ratchets, thereby allowing continuous linear motion of the actuator beam in the direction towards the suspension spring. In the reverse direction however, the elastic pawl beam will engage with a ratchet position thereby preventing the actuator beam from moving in the direction away from the suspension spring. This way, the ratchet and pawl structure ensures that the suspension spring is irreversibly preloaded Hence, by moving the elastic pawl beams over the ratchet and positioning the elastic pawl beams in a predetermined ratchet position, the suspension spring may be mechanically preloaded with a predetermined compressive force. Each ratchet position may correspond to a predetermined compressive (preload) state of the spring. FIG. 4C depicts a photograph of an example of a MEMS structure comprising a mechanically locking mechanism comprising an actuator beam, (two) elastic pawl beams that engage with (two) ratchet structures that are formed in the MEMS support structure. Methods for producing mechanical MEMS elements such as the ratchet-pawl system are known and e.g. described in U.S. Pat. No. 8,480,302 or in the article by Pham et al, "Single mask, simple structure micro rotational motor driven by electrostatic comb-drive actuators", 2012, J. Micromech. Microeng. 22 (2012) 015008.

FIG. 5A-5C depict schematics and a photograph of a mechanical locking structure for use in a MEMS structure according to another embodiment of the invention. In particular, in FIG. 5A, a mechanical MEMS locking structure is depicted wherein the actuator beam 502 is connected by a mechanical two-state switch structure 506 to MEMS support structure 516. The actuator beam may be further connected to an end 510 of the suspension spring 512. A guiding element 514 connected to the MEMS support structure 516 may ensure that the actuator beam is moving in a desired direction and that the compressive force is applied to the elastic beam in that direction. The mechanical switch may comprise one or more curved so-called bistable beams 506 that are connected between two opposite sides of the MEMS support structure and to the actuator beam. Methods for producing mechanical MEMS elements such as the bistable beams are known and e.g. described in US200302970. Such structure may have two stable positions, i.e. a first position of the elastic beam (as shown in FIG. 5A) and a second position of the elastic beam (as shown in FIG. 5B). Switching to the second position may be achieved by activating the actuator that pushes the actuator beam that is guided by guiding element 514 in the direction of the suspension spring 512. At a certain moment, the actuator will force the elastic beam into its second stable position as depicted in FIG. 5B. In that case, the suspension spring is preloaded by a (static) compressive force that is maintained by the mechanical switch. FIG. 5C depicts a photograph of an example of a MEMS structure comprising a mechanical two-state switch. In this particular example the actuator beam is connected to the suspension spring and an intermediate mass structure that allows stable suspension of a proof mass using the suspension springs. If the actuator can only push and not pull, the original unstressed state cannot be recovered. In that case this may also function as an anti-reverse system.

Figure 6:
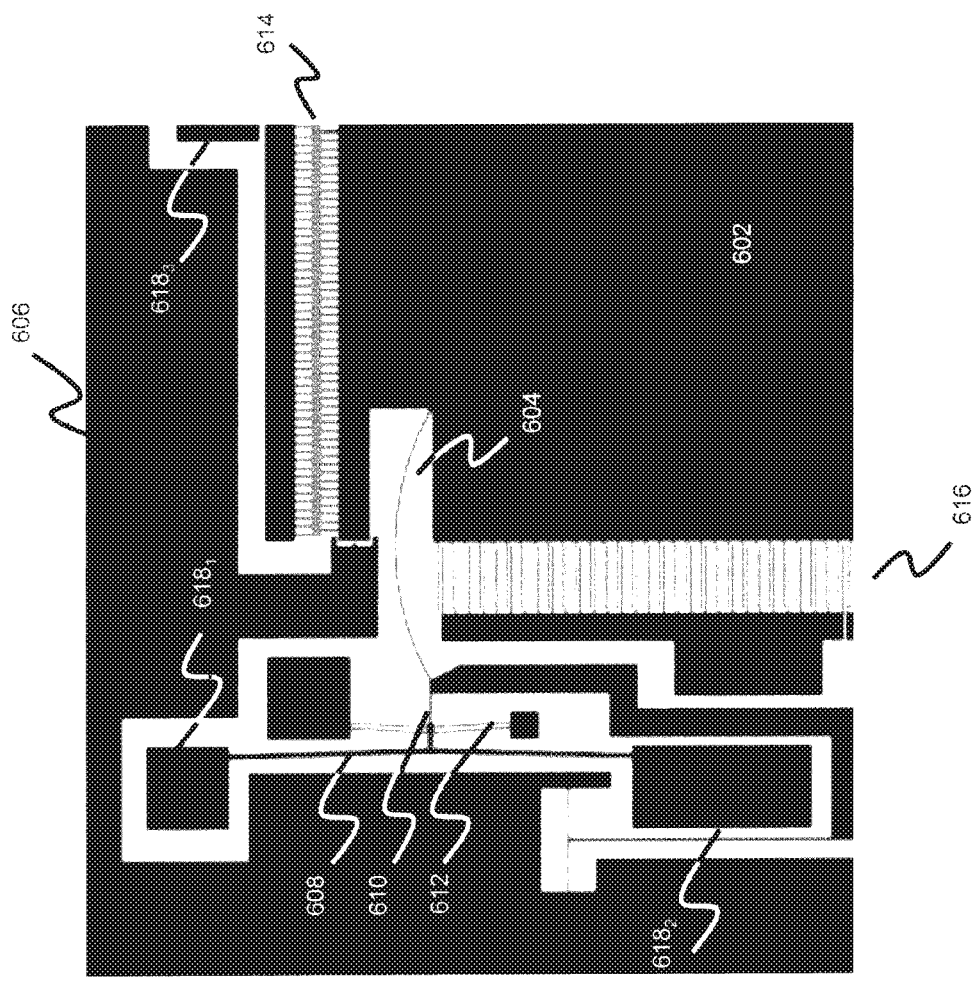
FIG. 6 depicts a top view of at least part of an inertial MEMS sensor according to an embodiment of the invention.

FIG. 6 depicts a top view of at least part of an inertial MEMS sensor according to an embodiment of the invention. In particular, FIG. 6 depicts the top view of a MEMS inertial sensor comprising a proof mass 602 that is suspended by suspension springs 604 to a MEMS support structure 606. One end of the suspension spring may be connected to an actuator 608 via an actuator beam 610. In this particular example, the suspension spring may have dimensions of 1000×5×25 micron, the thermal actuator 1700×10×25 micron, bistable beam pair 400(or 600)×5×25 micron, proof mass 3000×3000×25 micron. Depending on the desired properties of the system, the beam length L may be selected between 1000 and 5000 micron.

The actuator beam may be further connected to a mechanical locking mechanism 612 (as e.g. described in detail with reference to FIGS. 4 and 5) for maintaining the compressive force onto the suspension springs. The proof mass may comprise capacitive coupling members 614,616, e.g. interdigitated capacitor members that may be used to sense displacements of the suspended proof mass or to actuate it. Contact pads $618_{1-3}$ may be used to contact (e.g. by wire bonding) elements of the MEMS sensor. For example, the contact pads $618_{1,2}$ may be used for applying a current through the electro-thermal actuator 608 and the contact pad $618_3$ may be used for applying a bias voltage to one of the capacitor electrodes.

Figure 7:
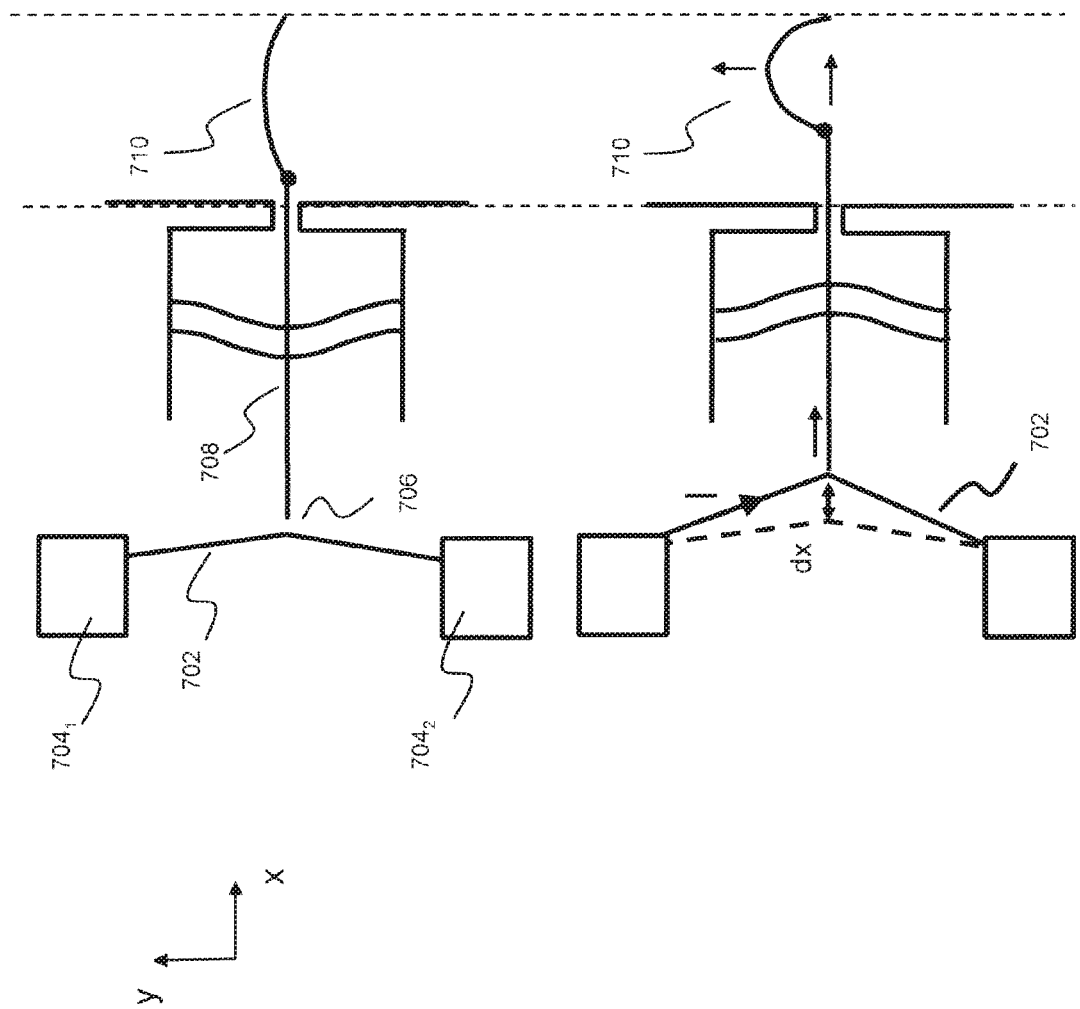
FIG. 7A and FIG. 7B depict an electro-thermal actuator for use in a MEMS sensor according to an embodiment of the invention.

FIGS. 7A and 7B depict an electro-thermal actuator for use in a MEMS sensor according to an embodiment of the invention. In this particular embodiment, the electro-thermal actuator may be implemented as a MEMS structure comprising a suspended (slightly) V-shaped silicon beam 702 of a certain conductivity (see also the actuator beam 502 in FIG. 5C) that may be formed in the same silicon layer in which all other MEMS elements, including the proof mass, the suspension springs and the locking mechanisms, may also be formed. The beam may be connected to bonding pads $704_{1,2}$ for applying a current through the beam. Further, the tip 706 of the V shaped beam may be connected to or close to the actuator beam 708, which is connected to the suspension spring(s) as e.g. 710.

When applying current I through the suspended V-shaped beam, Joule heating will occur and the thermal expansion of the beam will result in a displacement dx of the tip of the V-shape along the x-direction as shown in FIG. 7B. The displacement of the beam will push the actuator beam along the x-direction such that the suspension spring is mechanically preloaded with a certain compressive force. For example, when applying a current between 0 and 15 mA through a V-shaped silicon beam of 1700×10×25 micron, displacements dx of the order of 0 and 20 micron may be achieved. Although FIGS. 7A and 7B illustrate an electro-thermal actuator in combination with a locking mechanism of FIG. 5, other embodiments either with or without a locking mechanism are also foreseen.

A simplified analytical mathematical description of the embodiment of the invention with reference to FIG. 2, 3A, 3B can be made by using the model depicted in FIG. 8A-B. FIG. 8A depicts a proof mass suspended by two curved clamped-clamped beams with initial (un-compressed) projected along x length $L_0$. Hereafter the calculation is done for a single suspension beam and it can be straightforwardly generalized for any number of beams acting in parallel. Under the action of an external force $F_y$ (per beam), the proof-mass is pulled from equilibrium over a distance y. For small deflections the initial stiffness of each suspension beam $k_0$ is close to that of a straight beam (Eq. 7), $$k_0 = \frac{F_y}{y} \simeq \frac{12EI}{L_0^3}$$

where E is the beam material Young modulus and I is its second moment of area. Equivalently, one can define the beam tip rotational stiffness with respect to the beam base as (Eq. 8)

$$\kappa_0 = \frac{M}{\phi} = k_0 L_0^2,$$

with $\varphi=y/L_0$ and where $M=F_y L_0$ is the torque acting on the beam support frame. The natural frequency of the mass-spring system as configured in FIG. 8A is $f_0=\frac{1}{2}\pi\sqrt{k_0/m}$, where m is the suspended mass per beam.

FIG. 8B depicts the mass-spring system after a compressive force $F_x$ has been applied to the suspension beams. Such a force contributes to the torque acting on the beam support frame which, at some mass displacement y, becomes (Eq. 9)

$$M=F_y L+F_x y=\alpha k_0 L y$$

where $\alpha$ is a correction factor to the initial beam bending stiffness $k_0$. The correction factor is a function of $F_x$ through the geometrical parameters of the suspension beams, and it can be calculated by numerical integration of Eq. 6 or by Finite Element Modeling (FEM). From Eq. 9 y can be solved, resulting in a reduced stiffness per beam (Eq. 10)

$$k_1 = \alpha k_0 - \frac{F_x}{L}$$

In typical embodiments of the invention $L \sim L_0$. The natural frequency of the mass-spring system in compressed state is $f_1=\frac{1}{2}\pi\sqrt{k_1/m}$.

TABLE 1

Examples of design parameters for a MEMS inertial sensor according to the embodiments of the invention.

| | Sensor 1 | Sensor 2 |
|---|---|---|
| Mass (mg) | 0.45 | 30 |
| Number of springs | 4 | 16 |
| $L_0$ (μm) | 960 | 1660 |
| Uncompressed stiffness per beam $k_0$(N/m) | 0.55 | 1.1 |
| Uncompressed frequency $f_0$ (Hz) | 355 | 122 |
| Correction factor $\alpha$ | 0.85 | 0.85 |
| Beam compression (μm) | 19 | 32.9 |
| Compression force $F_x$ (μN) | 423 | 1465 |
| Compressed frequency $f_1$ (Hz) | 84 | 28 |

Table 1 shows two examples of MEMS inertial sensor design, based on the model depicted in FIG. 8A-8B, according to the embodiments of the invention.

Figure 9A:
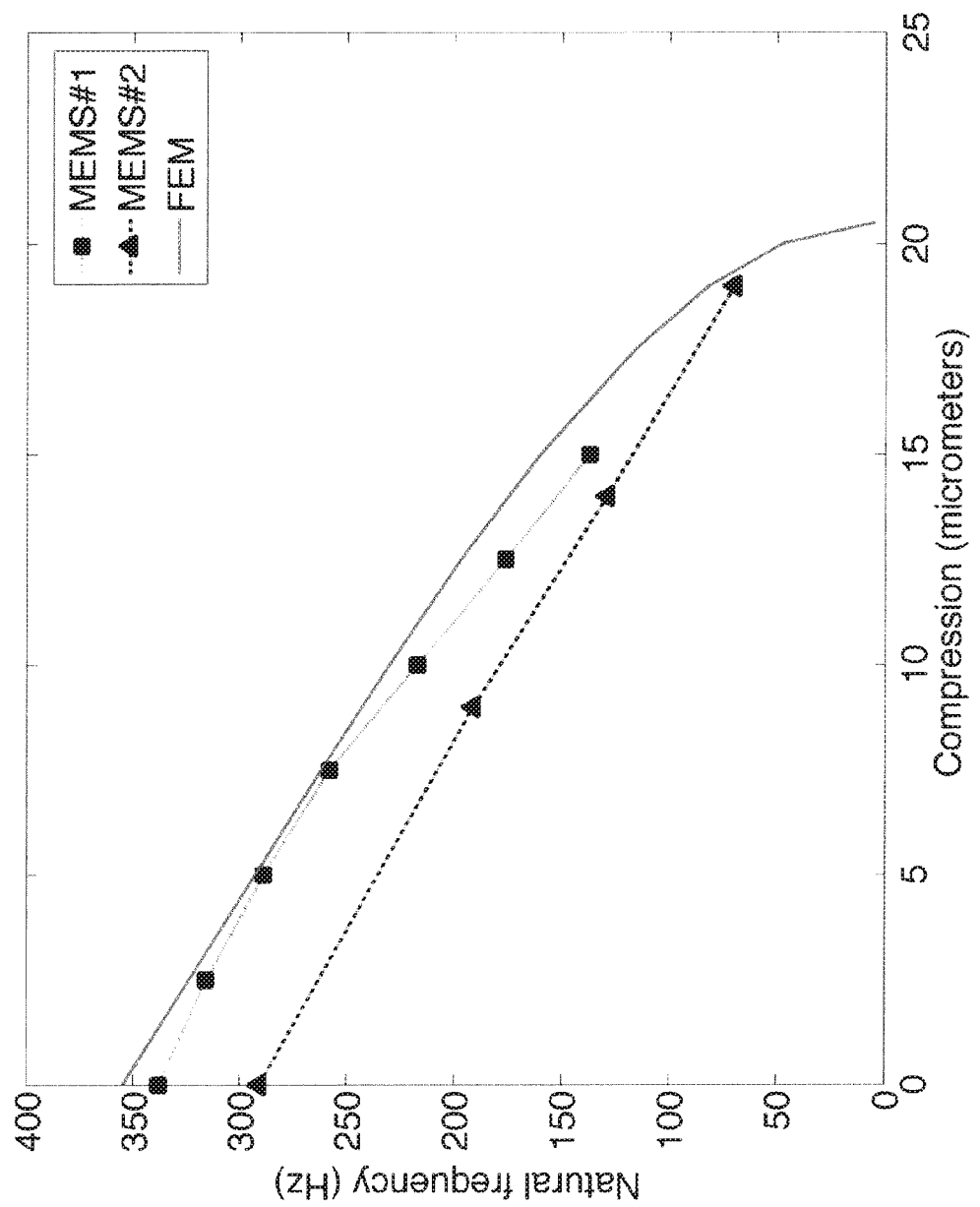
FIG. 9A and FIG. 9B depict graphs of the compression versus the natural frequency for two inertial MEMS sensors according to an embodiment of the invention.
Figure 9B:
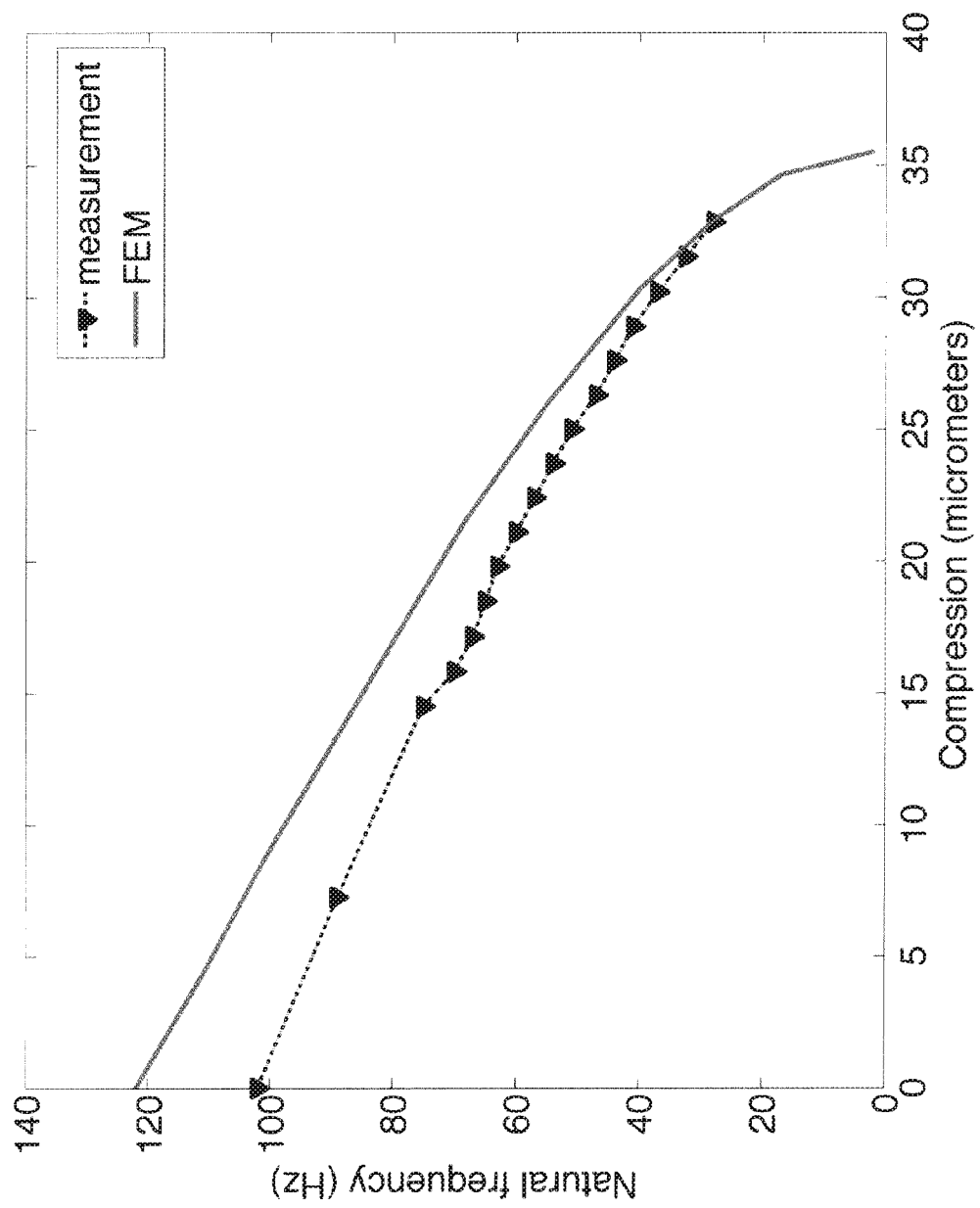

FIG. 9A-9B depict graphs of the measured natural frequency of MEMS inertial sensors that comprise preloaded suspension springs as described with reference to FIG. 3A-3B. FIG. 9A depicts the measurements done on two samples of a MEMS sensor comprising a proof mass of 0.45 mg. As reference the results of FEM model are also presented. As shown in the graph, the natural frequency f0 may be varied by controlling the compressive force on the suspensions springs. Here, the compressive force is expressed in terms of compressive deformation δx of the spring. Hence, for example, by controlling the actuators to induce a compressive deformation of around 9 micrometers in the suspension springs of MEMS-2, the natural frequency of the mass-spring system may be decreased from 290 Hz to approximately 190 Hz. Further increase of the spring compressive deformation up to 14 micrometers resulted in a natural frequency of around 130 Hz, i.e. less than half of the natural frequency of the MEMS sensor in its non-preloaded state thereby providing effective on-chip stiffness cancellation resulting in an increased sensitivity of the sensor. Further increase of the beam compression up to 19 micrometers provided a further decrease of the natural frequency down to 70 Hz, corresponding to a 17-fold stiffness reduction with respect to the as-processed state. It must be noticed that the out-of-plane (z-axis) natural frequency of the same device is 1300 Hz independently on the compression state. FIG. 9B depicts the same measurements done on a MEMS sensor comprising a proof mass of 30 mg. In this case, the as-processed natural frequency was 100 Hz. By means of the on-chip anti-spring mechanism the natural frequency was lowered down to 28 Hz, corresponding to a 14-fold stiffness reduction compared to the as-processed state of the MEMS sensor. Further compression of the suspension beams may result into a lower than 20 Hz operational natural frequency of the device.

Hence, this graph shows effective on-chip control of the natural frequency of the mass-spring MEMS structure is provided. By applying a compressive force to the suspension springs, the natural frequency of the mass-spring system may be controlled between $f_0$ and $0.1 \cdot f_0$, preferably between $f_0$ and $0.2 \cdot f_0$, more preferably between $f_0$ and $0.3 \cdot f_0$.

Figure 10A:
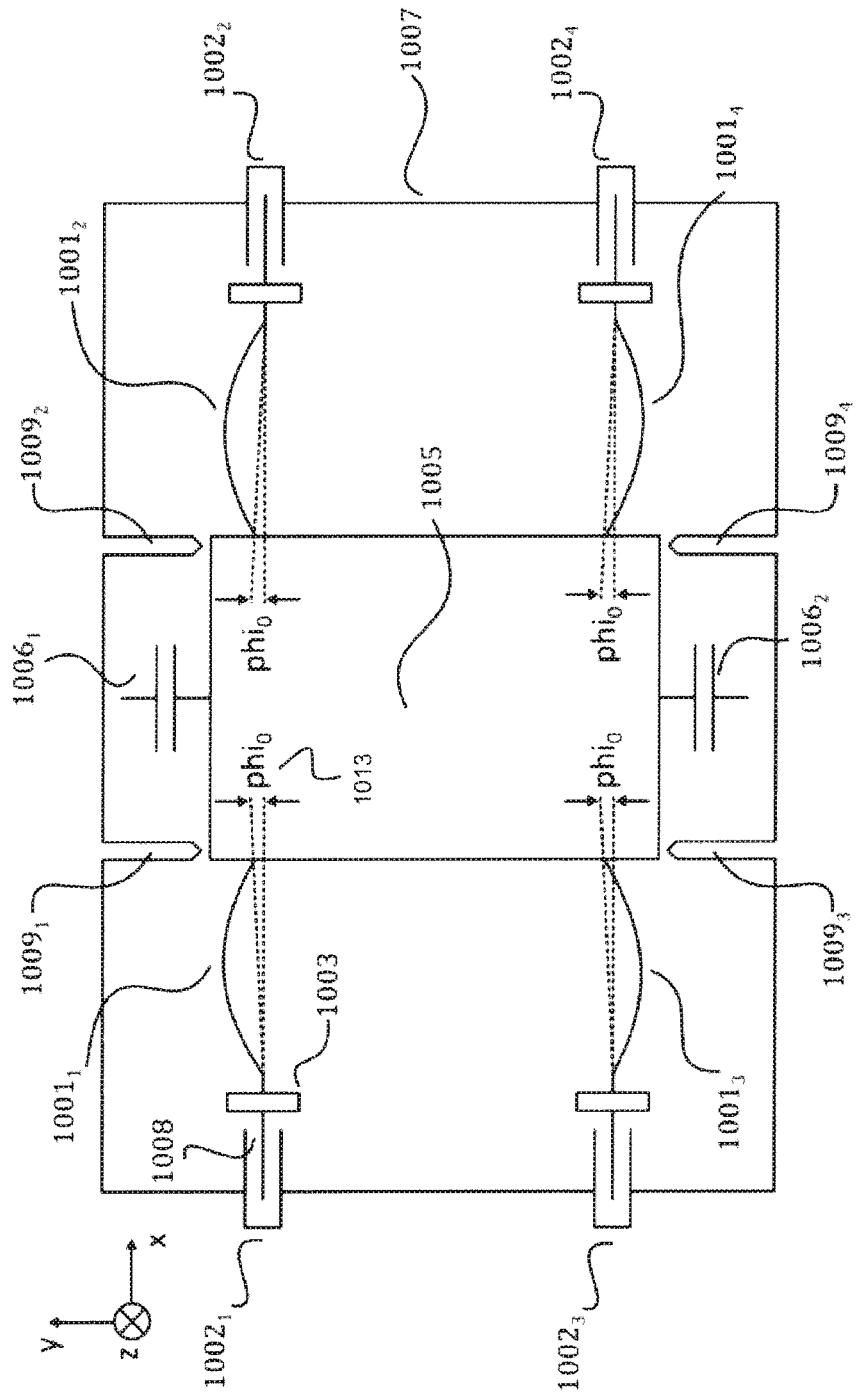
FIG. 10A-10E depicts a MEMS inertial sensor comprising suspension beams and compressive spring structure suitable to partial of full compensation of static gravity acceleration according to an embodiment of the invention.

FIG. 10A-10Z depict an inertial MEMS sensor according to various embodiments of the invention. In particular, FIG. 10A depicts an inertial MEMS sensor that is similar to those described with reference to FIG. 3A-3B in the sense that the MEMS sensor comprises a proof mass 1005 that is connected by a plurality of suspension beams $1001_{1-4}$ to a support structure 1007. The MEMS sensor may comprise actuators $1002_{1-4}$ for on-chip preloading of the suspension beams. In an embodiment, a curved suspension beam as described with reference to FIG. 2 may be used as suspension spring. In another embodiment, a stiff suspension beam may be used. The suspension beam may be compressed in a predetermined direction by the actuators comprising an actuation beam 1008 and, optionally, a guiding structure 1003. The support structure may be provided with end stop structures $1009_{1-4}$ for limiting the displacement of the proof mass along the sensitive axis (y) of the MEMS sensor (i.e. the axis of movement of the proof mass). In FIG. 10A the beams are in an uncompressed state, with the MEMS surface in horizontal orientation When compared with FIGS. 3A and 3B, the MEMS sensor in FIG. 10A comprises curved suspension beams that comprise an initial offset angle $\varphi_0$ 1013 with respect to the direction of motion of the proof mass (in this particular example the x-direction). This predetermined offset angle may be introduced in the structure during fabrication process. As will be described hereunder in more detail the initial offset angle $\varphi_0$ provides a means for compensating gravitational effects that may occur when the MEMS sensor is used in a vertical position, e.g. a position wherein the proof mass moves along the z-direction.

When compared to the embodiment depicted in FIG. 3A-3B, in the design of FIG. 10A an offset has been introduced between the connection points of beams to the proof mass relative to the connection points to the support structure, while the proof mass is kept centered with respect to the capacitive sensing and actuation structures $1006_{1,2}$. The offset is along the direction of the movement of proof mass and scales with an angle, initial offset angle $\varphi_0$, about the connection point to the compression structure. The dimensions and geometry of the proof mass and the curved suspensions springs may be selected such that the mass-spring system has a certain natural frequency $f_0$ when the suspensions springs are in their non-compressed state.

Thereafter, the curved suspension springs may be compressed by the built-in actuators until the desired compression state is reached. As an effect of the initial offset angle $\varphi_0$ (the offset) the proof mass will move along the y-axis when the beams are compressed until they are pushed against the end stops $1009_{1,2}$. This intermediate compressed state of the MEMS sensor, in horizontal state, is depicted in FIG. 10B.

Subsequently, the MEMS sensor is oriented in a vertical position. In that case, due to the effect of gravity, the proof-mass will move back to its initial position such that it is centred with respect to the sensing and actuation structures. This final configuration of the MEMS sensor is depicted in FIG. 10C. In this state, the natural frequency $f_1$ of the MEMS inertial sensor is determined by the initial (uncompressed state) stiffness of the suspension (as described in detail with reference to FIG. 10A) and by the pre-loading force applied to the suspension springs. Hence, from the above, it follows that by changing the orientation the suspension springs with respect to the direction of the mechanical preloading force, the MEMS sensor can be preferably configured to measure acceleration in horizontal, vertical or along any different inclination with respect to the direction of gravity. This way both frequency reduction and gravity compensation are achievable without electrical power consumption.

Figure 10B:
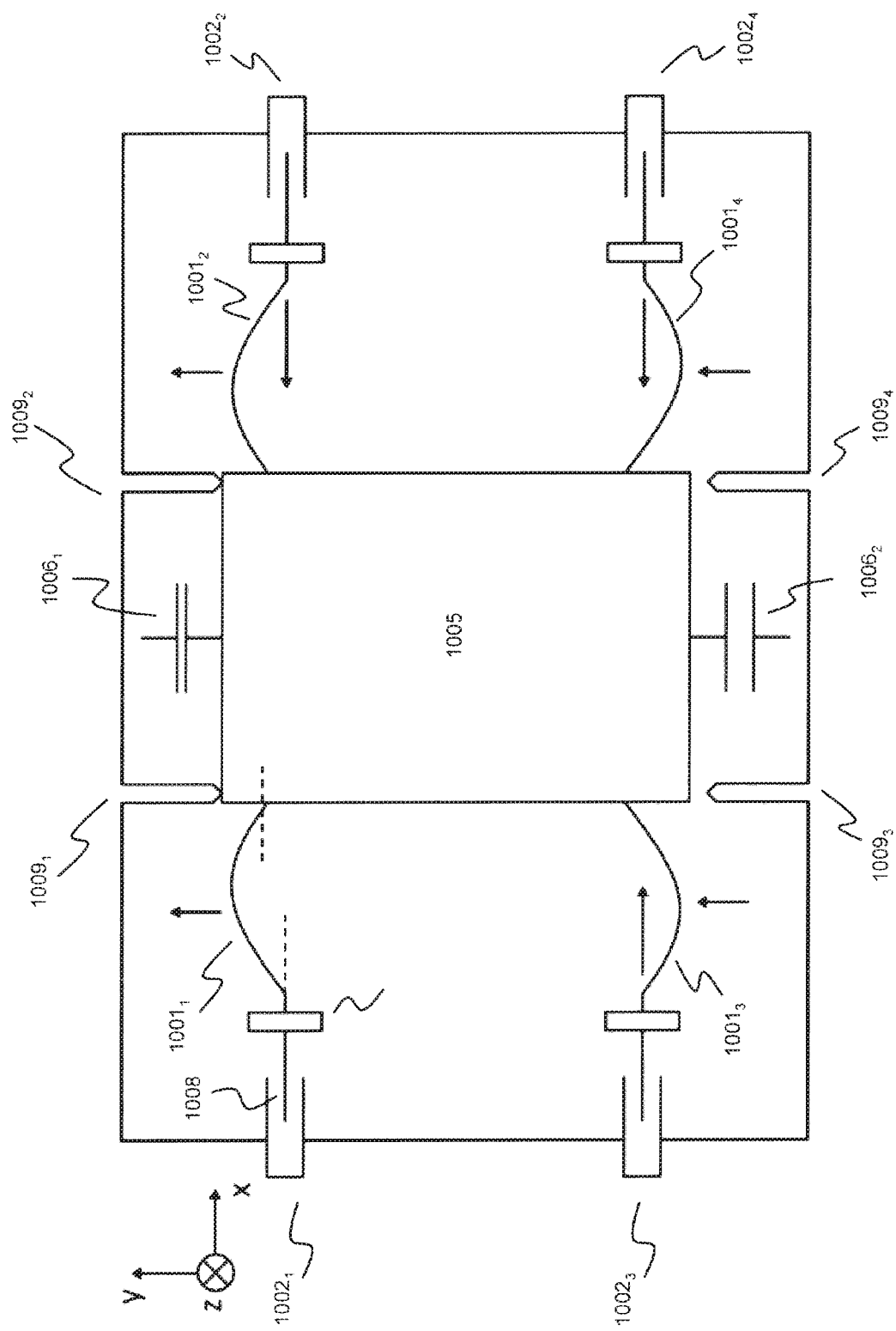
Figure 10C:
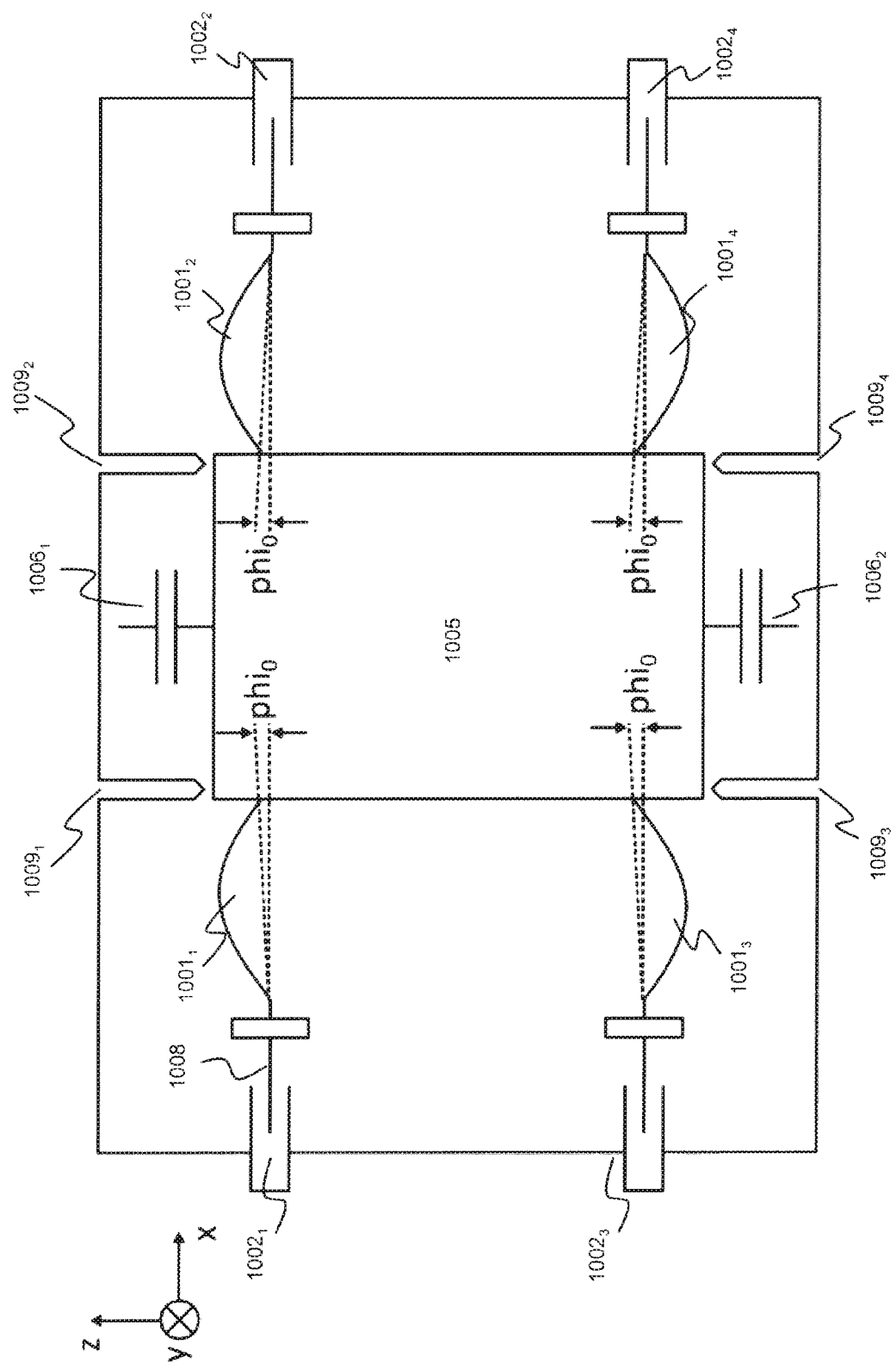
Figure 10D:
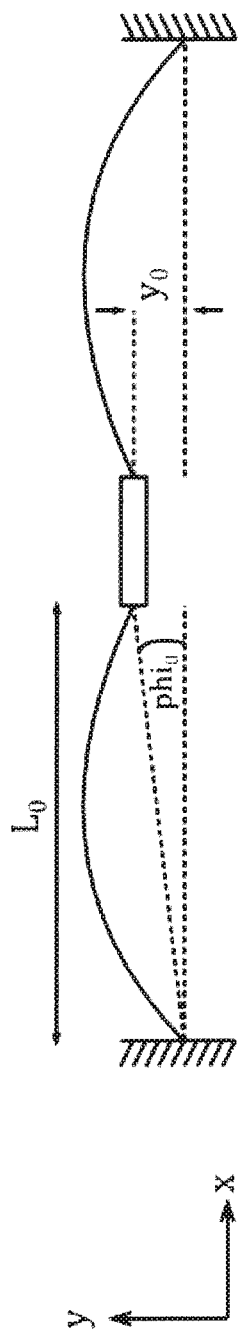

The embodiment of FIG. 10A-B may be simply described by using the model depicted in FIG. 10D-10Z. FIG. 10D depicts a mass suspended by two curved beams with initial (uncompressed) projected along x length $L_0$. In FIG. 10D the y axis is oriented horizontally. Due to the fact that the springs have an initial rotation angle $\varphi_0$, the proof-mass position along y is shifted by an amount $y_0$ with respect to the connection point between suspension springs and support structure of the suspension springs.

Figure 10E:
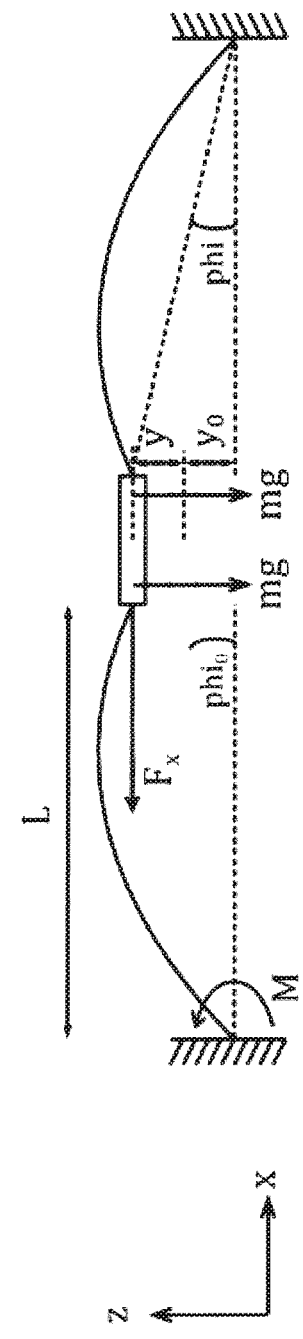

FIG. 10E depicts the mass-spring system after a compressive force $F_x$ has been applied to the suspension springs and after the y-axis of the system has been oriented vertically. The new equilibrium position of the proof-mass is shifted by an amount y with respect to the initial configuration. With reference to Eq. 9, the torque M on the support structure is given by (Eq. 11)

$$y = \frac{y_0 F_x - mgL}{\alpha k_0 L - F_x}$$

By solving Eq. 11, y can be determined as (Eq. 12)

$$y = \frac{y_0 F_x - mgL}{\alpha k_0 L - F_x} - mgL - \alpha k_0 L y = 0$$

By solving Eq. 12 the value of $y_0$ (and therefore $\varphi_0$) such that y=0 can be calculated (Eq. 13) as $$y_0 = \frac{mgL}{F_x}$$

The final stiffness (per spring) $k_1$, determined by differentiating Eq. 12, amounts to (Eq. 14)

$$k_1 = \alpha k_0 - \frac{F_x}{L}$$

which is the same as in Eq. 10. The natural frequency of the mass-spring system in the final state is $f1=\frac{1}{2}\pi\sqrt{k_1/m}$. It must be noticed that a more precise determination of the suspension geometrical parameters and pre-loading force is made by integrating numerically Eq. 6 or by finite-element-modeling (FEM). As an example, the design parameters shown in Table 1 can also be used for a vertical MEMS inertial sensor, according to this embodiment of the invention, by introducing $y_0$=2.5 micrometers and $y_0$=83 micrometers, respectively in Sensor 1 and Sensor 2.

This embodiment of the invention allows to design low natural frequency vertical MEMS inertial sensors in which the static effect of gravity on the proof-mass position is compensated passively by applying a suitable pre-loading to the suspension springs. The gravity compensation system is engaged once in the lifetime of the chip, after its fabrication, and does not require the application of any electrostatic field during the sensor operation. This will result in better noise performance and lower power consumption. Residual vertical imbalance, due to process inaccuracies, to local magnitude of gravity or to thermo-elastic effects, may be accommodated by the capacitive actuation system. Alternative configurations of the MEMS sensor with different orientation with respect to gravity, like Galperin (54.7 degrees from the vertical z-axis), may be implemented by adjusting $\varphi_0$.

Figure 11:
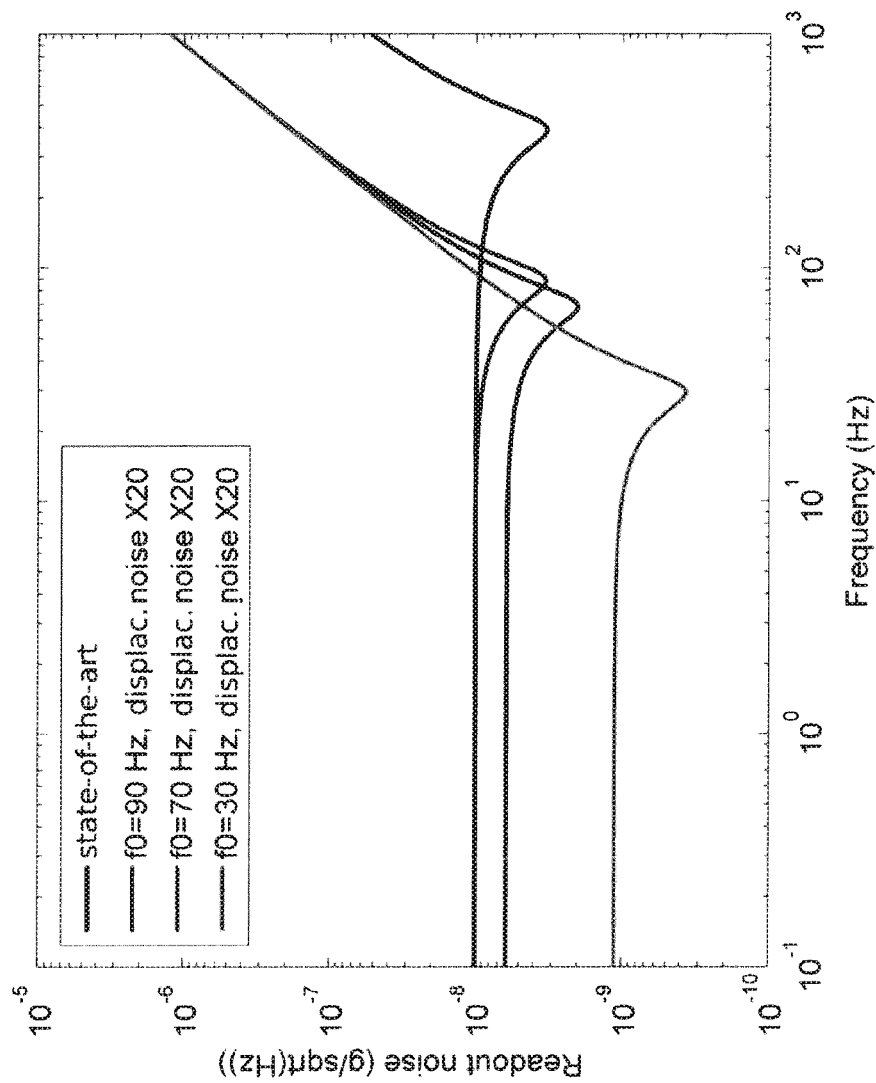
FIG. 11 depicts a comparison between the readout noise of a state of the art inertial MEMS sensor and an inertial MEMS sensor with a variable natural frequency.

FIG. 11 illustrates a graph showing a comparison between the acceleration noise contribution from the readout noise for a state-of-the-art MEMS seismic sensor that uses an optimized closed-loop readout scheme (in this case we refer to published results from U.S. Pat. No. 7,484,411B2) and several MEMS inertial sensors with twenty times larger displacement noise and with different lower natural frequencies. As shown in the graph an inertial sensor with a 90 Hz natural frequency and a 20 times worse displacement noise has substantially the same noise level as the best available MEMS sensors. When reducing the natural frequency from 70 down to 30 Hz, the readout noise is several orders of magnitude lower down to a few ng/√Hz which is close to the Brownian noise level of the system. These graphs show the significant impact of reducing the natural frequency on the sensitivity of the sensor.

Figure 12:
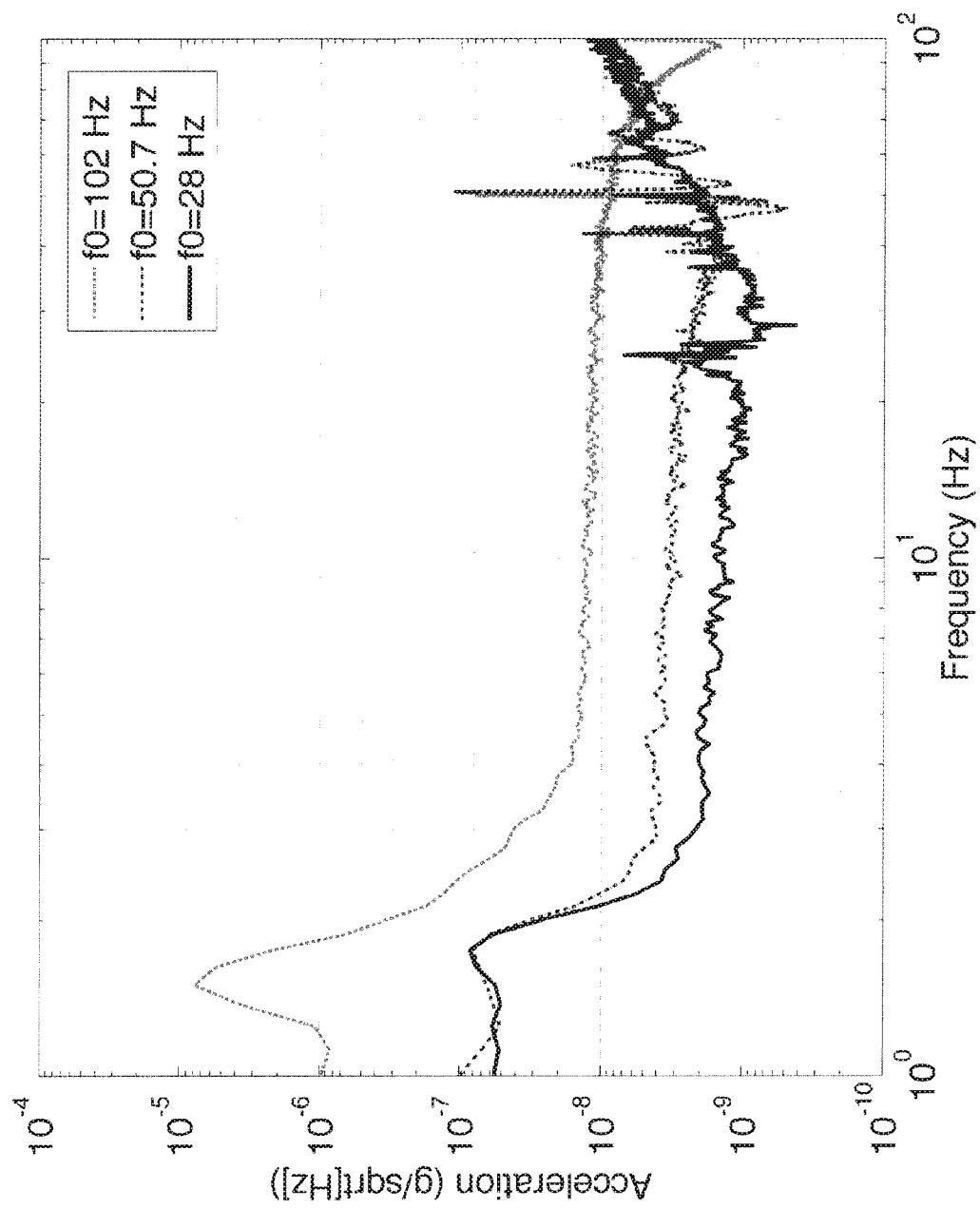
FIG. 12 depicts the measured output noise of an inertial MEMS sensor with variable natural frequency built according to an embodiment of the invention.

FIG. 12 depicts a graph showing the measured noise level, as a function of the natural frequency, of an inertial MEMS sensor comprising pre-loaded suspension springs as described with reference to FIG. 3A-3B. The measurement was performed with the MEMS sensor mounted on an in-vacuum ultra quiet platform with a residual acceleration better than $10^{-10}$ g/√Hz above 3 Hz. The MEMS sensor has a proof-mass of 30 mg and 102 Hz natural frequency in uncompressed state. The position of the proof-mass with respect to the support structure was read by connecting a conventional discrete components charge amplifier to the MEMS capacitive sensing structures. The position readout noise was measured to be $3 \cdot 10^{-13}$ m/√Hz. In all data sets shown in the graph the vacuum level was adjusted in order to make the Brownian noise level contribution negligible: in particular the measurements with f0=102 Hz and f0=50.7 Hz were performed at 100 mTorr, while the measurement with f0=28 Hz was performed at 10 mTorr. The graph shows how the measured background signal decreases in level at low frequencies by reducing the natural frequency of the MEMS sensor by means of the anti-spring mechanism. Noise levels of the order of $10^{-9}$ g/$\sqrt{Hz}$ are achieved. It has to be noticed that the noise shown in the graph below 3 Hz is due to the residual motion of the test platform and it is not a feature of the MEMS sensor output, for which, according to Eq. 1 and Eq. 2, the nano-g/$\sqrt{Hz}$ level resolution is expected to extend down to very low frequencies (almost DC).

The MEMS structure described within this application may be fabricated by using well known semiconductor processing techniques, including lithography, etching and deposition techniques. MEMS structures may be fabricated by using for example a Silicon On Glass (SOG) or a Silicon On Insulator (SOI) technology that is suitable for integration with CMOS. In SOG MEMS structures are formed in a silicon substrate that is bonded to a glass substrate. Similarly, in SOI MEMS structures may be formed in a silicon device layer between 10 and 50 micron, preferably 20 and 40 micron, that is bonded to a silicon support wafer of between 200 and 400 micron that is covered with an insulating dielectric layer, e.g. a $SiO_2$ layer, of a thickness between 1 and 5 micron. The mechanical anti-spring achieves equivalent cross axis rejection ratio in just a single etching step and single wafer.

By etching the silicon device layer and removing part of the $SiO_2$ layer underneath the etched structures, free suspending MEMS structures may be realized in the silicon device layer. These MEMS structures may be designed such that the suspending proof masses, suspension springs and locking structures as described in this application are all realized in the same silicon device layer. This way, very sensitive inertial MEMS sensor may be realized in a relatively simple process that does not require complex multilayer processing.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A MEMS sensor comprising:
    a support structure;
    a plurality of suspension springs connected to the support structure;
    a proof mass flexibly suspended by the suspension springs, the proof mass and the suspension springs forming a proof mass-spring system;
    a guiding structure for guiding a movement of the proof mass in a first direction, the first direction defining a sensing direction of the MEMS sensor; and
    an actuator connected to or in engagement with at least one of the suspension springs for mechanically preloading said at least one of the suspension springs with a compressive force, wherein the actuator is configured to move an end of said at least one of the suspension springs in a second direction which is different from the first direction and wherein the compressive force reduces a natural frequency $f_0$ of the proof mass-spring system.

2. The MEMS sensor according to claim 1 further comprising a lock for maintaining the compressive force to said at least one of the suspension springs.

3. The MEMS sensor according to claim 2 wherein the lock is configured for switching said at least one of the suspension springs from a non-compressed state to one or more compressed states.

4. The MEMS sensor according to claim 3 wherein the lock comprises at least one ratchet and a pawl, the at least one ratchet comprising one or more ratchet positions associated with the one or more compressed states respectively.

5. The MEMS sensor according to claim 2 wherein the lock comprises a two state locking spring system connected to said at least one of the suspension springs for switching said at least one of the suspension springs between a non-compressed state and a compressed state.

6. The MEMS sensor according to claim 1 wherein at least part of said at least one of the suspension springs is configured as a curved beam.

7. The MEMS sensor according to claim 1 wherein the reduced natural frequency $f_0$ is selected between 500 and 1 Hz.

8. The MEMS sensor according to claim 1 wherein the proof mass is a substantially planar element and wherein a direction of the compressive force is in a plane of the proof mass.

9. The MEMS sensor according to claim 1 wherein at least two suspension springs are connected to opposite sides of the proof mass and wherein the at least two suspension springs are preloaded with a compressive force of substantial similar magnitude.

10. The MEMS sensor according to claim 1 wherein the proof mass further comprises one or more capacitive elements for detecting movements of the proof mass.

11. The MEMS sensor according to claim 1 wherein said at least one of the suspension springs is mechanically preloaded using an electro-thermal actuator comprising an V-shaped suspended conductive beam, wherein a tip of the V-shaped suspended conductive beam is displaced in a predetermined direction as a function of a current that runs through the conductive beam.

12. The MEMS sensor according to claim 1 wherein each of the suspension springs are connected in a predetermined orientation with respect to the proof mass.

13. A method for mechanically preloading at least one suspension spring of a plurality of suspension springs, which flexibly connect a proof mass to a support structure of a MEMS sensor, with a compressive force, the method comprising:
    activating an actuator connected to or in engagement with the at least one suspension spring to move in a direction which is different from a direction in which the proof mass can move, wherein before activating the actuator the at least one suspension spring is in a non-compressed state; and, mechanically preloading the at least one suspension spring by transforming a displacement of the activated actuator into the compression force in the at least one suspension spring.

14. The method according to claim 13 further comprising:
deactivating the actuator if the displacement activates a locking mechanism for maintaining a predetermined compressive force on the at least one suspension spring.

15. The method according to claim 13 wherein the actuator is an electro-thermal actuator comprising a V-shaped suspended conductive beam, the method comprising:
activating the actuator by running a predetermined current through the V-shaped suspended conductive beam, wherein a tip of the V-shaped suspended conductive beam is displaced as a function of the current.

16. The MEMS sensor according to claim 1 wherein the actuator comprises a guided actuator beam connected to and/or engaged with the end of said at least one of the suspension springs.

17. The MEMS sensor according to claim 1 wherein the actuator is configured to apply the compressive force to said at least one of the suspension springs for controlling the natural frequency $f_0$ between $f_0$ and $0.1 * f_0$.

18. The MEMS sensor according to claim 1 wherein the proof mass further comprises one or more capacitive elements for using the MEMS sensor in a closed loop configuration.

* * * * *